United States Patent [19]
Sumida

[11] Patent Number: 6,057,726
[45] Date of Patent: May 2, 2000

[54] OUTPUT CIRCUIT FOR POWER IC WITH HIGH BREAKDOWN VOLTAGE

[75] Inventor: Hitoshi Sumida, Nagano, Japan

[73] Assignee: Fuji Electric Co., Ltd., Japan

[21] Appl. No.: 09/054,945

[22] Filed: Apr. 3, 1998

[30] Foreign Application Priority Data

Apr. 3, 1997 [JP] Japan .................................. 9-084808
Jun. 10, 1997 [JP] Japan .................................. 9-151740

[51] Int. Cl.[7] ................................................. H03L 5/00
[52] U.S. Cl. ........................ 327/333; 327/112; 326/68; 326/80
[58] Field of Search ................................... 327/108, 112, 327/333, 434; 326/62, 63, 68, 75, 80

[56] References Cited

U.S. PATENT DOCUMENTS

| | | | |
|---|---|---|---|
| 5,338,978 | 8/1994 | Larsen et al. ............................. | 327/333 |
| 5,352,942 | 10/1994 | Tanaka et al. ............................ | 326/63 |
| 5,510,731 | 4/1996 | Dingwall .................................. | 327/333 |
| 5,786,723 | 7/1998 | Kim ........................................ | 327/333 |

*Primary Examiner*—Jung Ho Kim
*Attorney, Agent, or Firm*—Rossi & Associates

[57] ABSTRACT

An output circuit for a high-breakdown-voltage power IC is provided. The output circuit includes a level-shift circuit on constant-current type including an output terminal connected to the gate of a p-channel MOSFET with a high breakdown voltage; a totem-pole circuit including an n-channel MOSFET with a high breakdown voltage on the high potential side of the totem-pole circuit, the gate of which is connected to the drain of the MOSFET via a high resistance; an n-channel MOSFET with a high breakdown voltage on the low potential side of the totem-pole circuit, and one single power supply having a plurality of terminals, the voltages thereof are different, used for a low-voltage power supply for driving the level-shift circuit and a high-voltage power supply for driving the totem-pole circuit.

22 Claims, 20 Drawing Sheets

OUTPUT CIRCUIT FOR POWER IC WITH HIGH BREAKDOWN VOLTAGE

FIELD OF THE INVENTION

The present invention relates in general to an output circuit for a power IC with a high breakdown voltage. More specifically, the present invention relates to an output circuit which includes a level-shift circuit and a totem-pole circuit, and still further to an output circuit which drives such loads as an inverter, discharge tube of a plasma display panel.

BACKGROUND OF THE INVENTION

Recently, power IC's with a high breakdown voltage, which integrate high-breakdown-voltage devices such as diodes, insulated gate bipolar transistors (hereinafter referred to as "IGBTs") and MOSFET's with their driving, control and protection circuits on one silicon substrate, have been rapidly developed based on progress achieved in separation techniques such as junction-separation and dielectric-separation. In particular, the progress made with respect to the dielectric-separation technique, which combines the laminated wafer (hereinafter referred to as the "SOI wafer") and trench technique, has facilitated integrating a plurality of high-breakdown-voltage bipolar devices with a high breakdown voltage and unipolar devices with a high breakdown voltage and expanded the applications of the power IC's. For example, a totem-pole circuit which employs insulated gate bipolar devices with a high breakdown voltage such as IGBT's or an integrated circuit which connects such totem-pole circuits in tandem are formed on one single chip.

FIG. 34 is a circuit diagram of a conventional output circuit of a power IC with a high breakdown voltage including a totem-pole circuit. As shown in FIG. 34, the conventional output circuit includes a totem-pole circuit 2a including two n-channel MOSFETs N1 and N2 with a high breakdown voltage and a conventional level-shift circuit 1c which drives the gate of the MOSFET N1 on the high potential side. The totem-pole circuit 2a is widely applied to inverter IC's for driving motors, driver IC's for driving display devices and such IC's. The level-shift circuit 1c needs an independent low voltage power supply VL in addition to an n-channel MOSFET N7 with a high breakdown voltage, resistors with high resistance R2, R3, R6 and a p-channel MOSFET P3 with a low breakdown voltage.

FIG. 35 is a circuit diagram of another conventional output circuit of a power IC with a high breakdown voltage including a push-pull circuit. The push-pull circuit is different from the foregoing totem-pole circuit 2a in that the push-pull circuit includes a p-channel device with a high breakdown voltage on the high potential side, i.e. on the upper arm side, instead of the n-channel device with a high breakdown voltage. Referring now to FIG. 35, the p-channel device is a p-channel MOSFET P4 with a high breakdown voltage. By employing a p-channel device and an n-channel device, the reference potential of the power supply for gate drive may be made coincide with the potential of the output terminal and the driver circuit, including the level-shift circuit 1a, for driving the device on the upper arm may be simplified.

The conventional output circuit of FIG. 34 needs an independent power supply for the level-shift circuit thereof. The provision of the independent power supply does not pose any serious problem to IC's including a few output circuits such as a three-phase inverter IC. However, the provision of the independent power supply poses serious problems to IC's including many output circuits, such as a display driver IC, which includes several tens of output circuits. Although not illustrated, a charge-pump circuit may be used in substitute for the level-shift circuit, but it has the same problems discussed above. Since the totem-pole circuit employs the same n-channel devices on the upper arm and the lower arm (the low potential side), the so-called arm-short-circuit in which the upper and lower arms are simultaneously in the on-state thereof tends to be caused. Therefore, countermeasures for preventing the arm-short-circuit are necessary. In addition, countermeasures for making flow a reverse current, which flows through the devices constituting the totem-pole circuit depending on the state of load, are necessary especially when an IGBT is used for the device of the totem-pole circuit.

The current carrying capability of the p-channel MOSFET which constitutes the push-pull circuit of FIG. 35 is inferior to that of the n-channel device. Therefore, it is necessary to increase the current carrying area of the p-channel MOSFET on the upper arm for making the current of same magnitude flow through the p-channel MOSFET on the upper arm as well as through the n-channel MOSFET on the lower arm. The adverse effects of the widened current carrying area cancel the effects of the simplified gate driver circuit. As a result, the chip size for the push-pull circuit exceeds the chip size for the totem-pole circuit, which further causes chip cost increase.

In view of the foregoing, it is an object of the present invention to provide an output circuit for a power IC with a high breakdown voltage which obviates the foregoing problems. It is another object of the present invention to provide an output circuit for a power IC with a high breakdown voltage which does not need any independent power supply. It is still another object of the present invention to provide an output circuit for a power IC with a high breakdown voltage which facilitates preventing the arm-short-circuit from causing. It is a further object of the present invention to provide an output circuit for a power IC with a high breakdown voltage which facilitates making a reverse current flow and reducing the chip size.

SUMMARY OF THE INVENTION

According to the invention, an output circuit for a power IC with a high breakdown voltage is provided, which output circuit includes a totem-pole circuit including an n-channel MOSFET with a high breakdown voltage on the high potential side of the totem-pole circuit and an n-channel MOSFET with a high breakdown voltage on the low potential side of the totem-pole circuit; a level-shift circuit which drives the n-channel MOSFET on the high potential side; a p-channel MOSFET with a high breakdown voltage between the gate of the n-channel MOSFET on the high potential side and the output port of the level-shift circuit, the gate of the p-channel MOSFET being connected to the output port of the level-shift circuit; a first resistor between the gate of the n-channel MOSFET on the high potential side and the drain of the p-channel MOSFET; and a power supply, the high potential side thereof being connected to the source of the p-channel MOSFET.

According to the invention, there is provided an output circuit for a power IC with a high breakdown voltage, which output circuit includes a totem-pole circuit including an n-channel MOSFET with a high breakdown voltage on the high potential side of the totem-pole circuit, an n-channel MOSFET with a high breakdown voltage on the low potential side of the totem-pole circuit, and an output terminal including a connection point connecting the source of the n-channel MOSFET on the high potential side and the drain of the n-channel MOSFET on the low potential side; a level-shift circuit which drives the n-channel MOSFET on the high potential side; a p-channel MOSFET with a high breakdown voltage, the gate thereof being connected to the output port of the level-shift circuit; a first resistor between the gate of the n-channel MOSFET on the high potential side and the drain of the p-channel MOSFET; a power supply, the high potential side thereof being connected to the source of the p-channel MOSFET; a second resistor; a diode; the first end of the second resistor and the cathode of the diode being connected to the gate of the n-channel MOSFET on the high potential side; and the second end of the second resistor and the anode of the diode being connected to the source of the n-channel MOSFET on the high potential side.

The circuit configuration described above does not need the conventional separate power supplies and operates the level-shift circuit and the totem-pole circuit with one power supply.

According to the invention, there is provided an output circuit for a power IC with a high breakdown voltage, which output circuit includes a totem-pole circuit including an n-channel MOSFET with a high breakdown voltage on the high potential side of the totem-pole circuit, an n-channel MOSFET with a high breakdown voltage on the low potential side of the totem-pole circuit, a diode and an output terminal including a connection point connecting the source of the n-channel MOSFET on the high potential side and the anode of the diode, the cathode of the diode being connected to the drain of the n-channel MOSFET on the low potential side, a level-shift circuit which drives the n-channel MOSFET on the high potential side; a p-channel MOSFET with a high breakdown voltage, the gate thereof being connected to the output port of the level-shift circuit, a first resistor between the gate of the n-channel MOSFET on the high potential side and the drain of the p-channel MOSFET; a power supply, the high potential side thereof being connected to the source of the p-channel MOSFET; a third resistor between the gate and the source of the n-channel MOSFET on the high potential side; and the gate of the n-channel MOSFET on the high potential side being connected to the cathode of the diode.

In the circuit configuration described above, the gate potential of the n-channel MOSFET on the high potential side connected to the cathode of the diode is suppressed to be lower than the potential of its source, when a current is made flow through the diode by the turning on the n-channel MOSFET on the low potential side. Due to this potential scheme, the n-channel MOSFET on the high potential side is kept in its off-state without fail as far as the n-channel MOSFET on the low potential side is in its on state. Thus, the arm-short-circuit is prevented from causing without fail.

According to the invention, there is provided an output circuit for a power IC with a high breakdown voltage, which output circuit includes a totem-pole circuit including an n-channel MOSFET with a high breakdown voltage on the high potential side of the totem-pole circuit, an n-channel MOSFET with a high breakdown voltage on the low potential side of the totem-pole circuit, a diode, a first auxiliary diode, a second auxiliary diode and an output terminal including a connection point connecting the source of the n-channel MOSFET on the high potential side and the anode of the diode, the cathode of the diode being connected to the anode of the first a diode, the cathode of the first auxiliary diode being connected to the drain of the n-channel MOSFET on the low potential side, the source of the n-channel MOSFET on the high potential side being connected to the cathode of the second auxiliary diode, a level-shift circuit which drives the n-channel MOSFET on the high potential side; a p-channel MOSFET with a high breakdown voltage, the gate thereof being connected to the output port of the level-shift circuit; a first resistor between the gate of the n-channel MOSFET on the high potential side and the drain of the p-channel MOSFET; a power supply, the high potential side thereof being connected to the source of the p-channel MOSFET; a third resistor between the gate and the source of the n-channel MOSFET on the high potential side; and the gate of the n-channel MOSFET on the high potential side being connected to the cathode of the diode.

The circuit configuration described above facilitates preventing arm-short-circuit from causing and a current from flowing to the high potential side of the power supply via the parasitic diode of the n-channel MOSFET on the low potential side. In the circuit configuration described above, the first auxiliary diode works as a free-wheeling diode.

According to the invention, there is provided an output circuit for a power IC with a high breakdown voltage, which output circuit includes a totem-pole circuit including an n-channel MOSFET with a high breakdown voltage on the high potential side of the totem-pole circuit, an n-channel MOSFET with a high breakdown voltage on the low potential Side of the totem-pole circuit, and an output terminal including a connection point connecting the source of the n-channel MOSFET on the high potential side and the drain of the n-channel MOSFET on the low potential side; a level-shift circuit which drives the n-channel MOSFET on the high potential side, a p-channel MOSFET with a high breakdown voltage, the gate thereof being connected to the output port of the level-shift circuit; a first resistor between the gate of the n-channel MOSFET on the high potential side and the drain of the p-channel MOSFET; a power supply, the high potential side thereof being connected to the source of the p-channel MOSFET; a third resistor between the gate and the source of the n-channel MOSFET on the high potential side, a diode, the anode thereof being connected to the source of the n-channel MOSFET on the high potential side; a first auxiliary n-channel MOSFET with a high breakdown voltage, the drain thereof being connected to the gate of the n-channel MOSFET on the high potential side; the gate of the auxiliary n-channel MOSFET being connected to the gate of the n-channel MOSFET on the low potential side, and the source of the auxiliary n-channel MOSFET being connected to the source of the n-channel MOSFET on the low potential side.

In the circuit configuration described above, the gate potential of the n-channel MOSFET on the high potential side connected to the cathode of the diode is suppressed to be lower than the potential of its source, when a current is made flow through the diode by the turning on the first auxiliary n-channel MOSFET simultaneously with the n-channel MOSFET on the low potential side. Due to this potential scheme, the n-channel MOSFET on the high potential side is kept in its off-state without fail as far as the n-channel MOSFET on the low potential side is in its on-state. Thus, the arm-shortcircuit is prevented from causing without fail.

According to the invention, there is provided an output circuit for a power IC with a high breakdown voltage, which output circuit includes a totem-pole circuit, the totem-pole circuit comprising an n-channel MOSFET's a high breakdown voltage on the high potential side of the totem-pole circuit, an n-channel MOSFET with a high breakdown voltage on the low potential side of the totem-pole circuit, and an output terminal including a connection point connecting the source of the n-channel MOSFET on the high potential side and the drain of the n-channel MOSFET on the low potential side; a level-shift circuit which drives the n-channel MOSFET on the high potential side; a p-channel MOSFET with a high breakdown voltage, the gate thereof being connected to the output port of the level-shift circuit; a first resistor between the gate of the n-channel MOSFET on the high potential side and the drain of the p-channel MOSFET; a power supply, the high potential side thereof being connected to the source of the p-channel MOSFET; a third resistor between the gate and the source of the n-channel MOSFET on the high potential side; a diode, the anode thereof being connected to the source of the n-channel MOSFET on the high potential side; the cathode of the diode being connected to the gate of the n-channel MOSFET on the high potential side; a first auxiliary diode, the anode thereof being connected to the cathode of the diode, a first auxiliary n-channel MOSFET with a high breakdown voltage, the drain thereof being connected to the cathode of the first auxiliary diode; the gate of the first auxiliary n-channel MOSFET being connected to the gate of the n-channel MOSFET on the low potential side; and the source of the auxiliary n-channel MOSFET being connected to the source of the n-channel MOSFET on the low potential side.

The circuit configuration described above facilitates preventing arm-short-circuit from causing. In addition, the first auxiliary diode prevents a current from flowing to the high potential side of the power supply via the parasitic diode of the first auxiliary n-channel MOSFET.

According to the invention, there is provided an output circuit for a power IC with a high breakdown voltage, which output circuit includes a totem-pole circuit including an n-channel MOSFET with a high breakdown voltage on the high potential side of the totem-pole circuit, an n-channel MOSFET with a high breakdown voltage on the low potential side of the totem-pole circuit, and an output terminal including a connection point connecting the source of the n-channel MOSFET on the high potential side and the drain of the n-channel MOSFET on the low potential side, a level-shift circuit which drives the n-channel MOSFET on the high potential side, a p-channel MOSFET with a high breakdown voltage, the gate thereof being connected to the output port of the level-shift circuit, a first resistor between the gate of the n-channel MOSFET on the high potential side and the drain of the p-channel MOSFET; a power supply, the high potential side thereof being connected to the source of the p-channel MOSFET; a second resistor; a diode, the first end of the second resistor and the cathode of the diode being connected to the gate of the n-channel MOSFET on the high potential side; the second end of the second resistor and the anode of the diode being connected to the source of the n-channel MOSFET on the high potential side; the drain of the n-channel MOSFET on the low potential side including a first region and a second region, the first region making a main current flow, the second region making a part of the main current flow, the first region and the second region being spaced apart from each other; the first region being connected to the source of the n-channel MOSFET on the high potential side; and the second region being connected to the gate of the n-channel MOSFET on the high potential side.

The first resistor in the output circuit described above may be omitted.

Advantageously, the n-channel MOSFET on the high potential side of the totem-pole circuit is replaced by an n-channel IGBT and a free-wheeling diode.

Advantageously, the n-channel MOSFET on the low potential side of the totem-pole circuit is replaced by an n-channel IGBT and a freewheeling diode, and the n-channel IGBT on the low potential side has a multi-collector structure including a first collector region and a second collector region spaced apart from each other.

Advantageously, the n-channel MOSFET on the high potential side of the totem-pole circuit is replaced by a first n-channel IGBT and a first free-wheeling diode, the n-channel MOSFET on the low potential side of the totem-pole circuit is replaced by a second n-channel IGBT and a second free-wheeling diode, and the second n-channel IGBT has a multi-collector structure including a first collector region and a second collector region, spaced apart from each other.

By adopting a multi-collector structure or a multi-drain structure for the device on the low potential side of the totem-pole circuit and by connecting an end of the multi-collector structure or the multi-drain structure to the gate of the device on the high potential side, the first auxiliary n-channel MOSFET may be omitted, since the device on the low potential side works also for arm-short-circuit prevention, and the occupied area of the output circuit is reduced.

Advantageously, the level-shift circuit includes a current mirror circuit including a p-channel MOSFET with a low breakdown voltage, a resistor with high resistance and two n-channel MOSFETs with a high breakdown voltage.

The level-shift circuit described above drives, with high reliability, the p-channel MOSFET with a high breakdown voltage.

Advantageously, the level-shift circuit includes a resistive-potential-divider circuit including two resistor with high resistance and an n-channel MOSFET with a high breakdown voltage.

The level-shift circuit described above reduces the number of constituent parts and devices.

It is also effective to substitute a pnp-transistor with a high breakdown voltage for the p-channel MOSFET with a high breakdown voltage for preventing arm-short-circuit from causing.

Advantageously, at least one of the n-channel MOSFET's in the totem-pole circuit is replaced by an IGBT.

The circuit configuration described above facilitates increasing the current capacity. By employing the IGBT on the arm of the totem-pole circuit through which a higher current flows when the current values through the upper arm and the lower arm are different from each other, e.g., in driving a load such as a plasma display, the chip size is reduced as compared with the totem-pole circuit which employs MOSFET's on the upper and lower arms.

Advantageously, at least one of the n-channel MOSFETs in the totem-pole circuit is replaced by an IGBT and a free-wheeling diode.

The circuit configuration described above facilitates making a current flowing in the reverse direction of the IGBT flow through the free-wheeling diode.

Advantageously, the at least one of the n-channel MOSFETs of the totem-pole circuit is replaced by an IGBT and a second auxiliary n-channel MOSFET with a high breakdown voltage connected in parallel to each other.

The circuit configuration described above facilitates making a reverse current flow through the parasitic diode of the second auxiliary n-channel MOSFET and a forward current flow through the IGBT and the second auxiliary n-channel MOSFET. That is, this circuit configuration facilitates making a high forward current flow.

Advantageously, the level-shift circuit includes a current mirror circuit including a p-channel MOSFET with a low breakdown voltage, a resistor with high resistance and two n-channel MOSFET's with a high breakdown voltage; and at least one of the n-channel MOSFETS in the totem-pole circuit is replaced by an IGBT, an IGBT and a free-wheeling diode, or an IGBT and a second auxiliary MOSFET with a high breakdown voltage connected in parallel with each other.

The combinations of the level-shift circuit and the totem-pole circuit described above exhibit the same effects with those described in the foregoing paragraphs.

Advantageously, the level-shift circuit includes a resistive-potential-divider circuit including two resistors with high resistance and an n-channel MOSFET with a high breakdown voltage; and the n-channel MOSFET with a high breakdown voltage in the totem-pole circuit include respective parasitic diodes; or at least one of the n-channel MOSFET's in the totem-pole circuit is replaced by an IGBT, an IGBT and a free-wheeling diode, or an IGBT and a second auxiliary MOSFET with a high breakdown voltage connected in parallel with each other.

The combinations of the level-shift circuit and the totem-pole circuit described above exhibit the same effects with those described in the foregoing paragraphs.

Advantageously, the level-shift circuit includes a resistor with high resistance connected in series to the n-channel MOSFET with a high breakdown voltage of the level-shift circuit for current limitation.

The high resistance for current limitation reduces the current consumption in the level-shift circuit for driving the device on the high potential side of the totem-pole circuit.

Advantageously, the level-shift circuit includes a constant-current circuit including a mirror circuit including a first n-channel MOSFET with a high breakdown voltage and a second n-channel MOSFET, the first and second n-channel MOSFET's having a structure with the same breakdown voltage.

Advantageously, the level-shift circuit includes a constant-current circuit including a mirror circuit including a first n-channel MOSFET with a high breakdown voltage and a second n-channel MOSFET, the first and second n-channel MOSFET's having a structure with the same breakdown voltage, and the channel width of the first n-channel MOSFET and the channel width of the second n-channel MOSFET being different from each other.

By narrowing the channel width of the n-channel MOSFET on the output side of the mirror circuit more than the channel width of the n-channel MOSFET on the input side of the mirror circuit, i.e., by increasing the channel resistance of the n-channel MOSFET on the output side of the mirror circuit more than the channel resistance of the n-channel MOSFET on the input side of the mirror circuit, the delay time of the mirror circuit is improved without increasing the current consumption in the constant current circuit.

BRIEF DESCRIPTION OF THE DRAWINGS

The invention will be described with reference to certain preferred embodiments thereof and the accompanying the drawings, wherein.

DETAILED DESCRIPTION OF THE PREFERRED EMBODIMENTS

Figure 1:
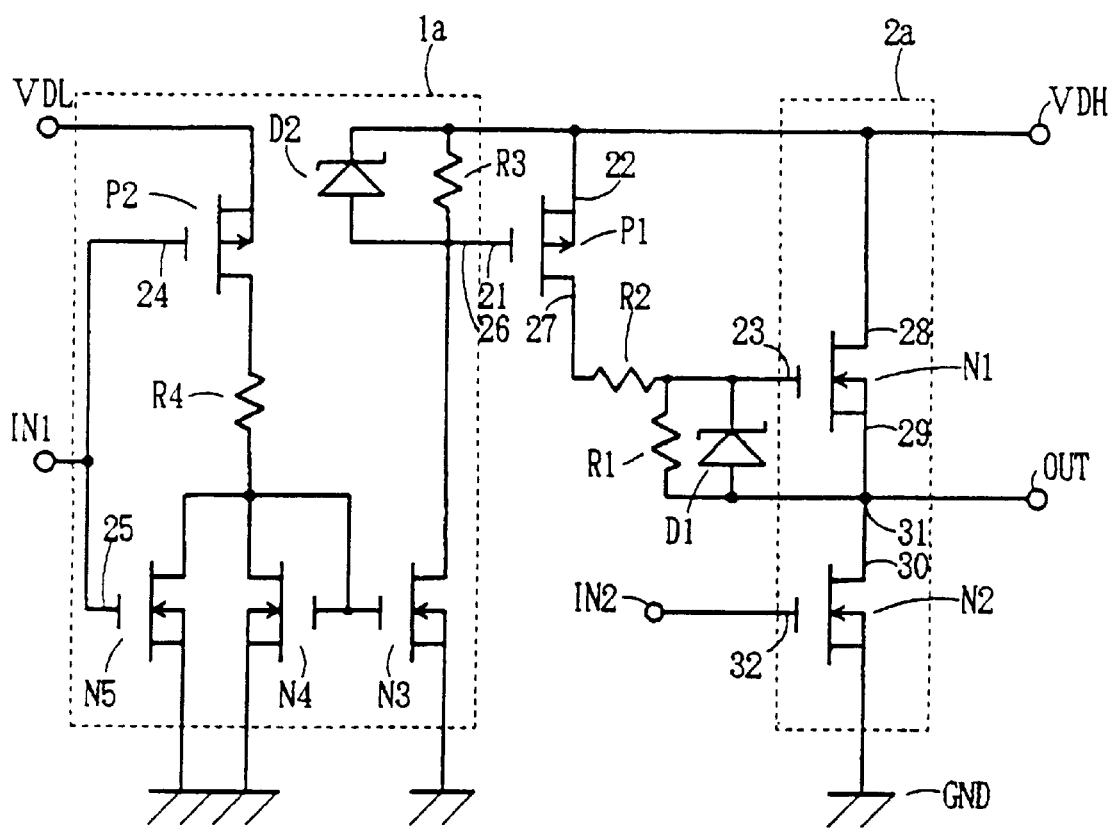
FIG. 1 is a circuit diagram of a first embodiment of an output circuit for a power IC with a high breakdown voltage according to the invention which connects a p-channel MOSFET with a high breakdown voltage to the output terminal of the level-shift circuit of the constant-current type.

FIG. 1 is a circuit diagram of a first embodiment of an output circuit for a power IC with a high breakdown voltage according to the invention which connects a p-channel MOSFET with a high breakdown voltage to the output terminal of the level-shift circuit of constant-current type.

Referring now to FIG. 1, the output terminal of a level-shift circuit 1a of constant-current type is connected to the gate 21 of a p-channel MOSFET P1 with a high breakdown voltage. The drain 27 of the MOSFET P1 is connected to, via a resistor R2 with high resistance, the gate 23 of an n-channel MOSFET N1 with a high breakdown voltage on the high potential side (on the upper arm) of a totem-pole circuit 2a. The level-shift circuit includes three n-channel MOSFET's N3, N4, N5, a resistor with high resistance R4 and a p-channel MOSFET P2 with a low breakdown voltage. This circuit is a constant-current circuit, i.e., the so-called current mirror circuit. The n-channel MOSFET N3 exhibits a high breakdown voltage. The n-channel MOSFET N4 has the same specifications with those of the n-channel MOSFET N3. The resistance of the resistors R3 and R4 is several tens of thousands of ohms. The resistor R4 suppresses the current fed to the constant current circuit. The resistor R3 suppresses the gate drive voltage of the MOSFET P1. A Zener diode D2 connected in parallel to the resistor R3 suppresses the over gate voltage caused across the resistor R3. The input terminal IN1 of the level-shift circuit is connected to the gates 24 and 25 of the MOSFET's P2 and N5. The output terminal 26 of the level-shift circuit is connected to the gate 21 of the p-channel MOSFET P1. The source of the p-channel MOSFET P2 is connected to a low-voltage power supply VDL of, e.g., 5 V. The totem-pole circuit 2a includes the n-channel MOSFET N1 on the high potential side and an n-channel MOSFET N2 with a high breakdown voltage on the low potential side. The drain 28 of the MOSFET N1 is connected to a high-voltage power supply VDH. The source of the MOSFET N2 is connected to the earth GND. The connection point 31 of the source 29 of the MOSFET N1 and the drain 30 of the MOSFET N2 is connected with the output terminal OUT of the totem-pole circuit. The gate 32 of the MOSFET N2 is connected to the input terminal IN2 of the totem-pole circuit. The low-voltage power supply VDL and high-voltage power supply VDH for driving the totem-pole circuit have a common reference potential, e.g., the earth potential.

The level-shift circuit 1a works as follows. The p-channel MOSFET P2 is turned on and the n-channel MOSFET N5 is turned off when an input signal for driving the n-channel MOSFET N1 on the upper arm of the totem-pole circuit is fed from the input terminal IN1 to the gates 24 and 25 of the respective MOSFET's P2 and N5 constituting the constant-current circuit of the level-shift circuit 1a of constant-current type. As the MOSFET P2 is turned on and the MOSFET N5 is turned off, the constant-current-circuit including the resistor R4 and the n-channel MOSFETs N4 and N3 works to make a same current flow to the n-channel MOSFET's N3 and N4. As the current flowing to the MOSFET N3 flows through the resistor R3, the gate 21 of the p-channel MOSFET P1 is biased and the MOSFET P1 is turned on. The current flowing through the MOSFET P1 flows through the resistor R1. The voltage across the resistor R1 is applied to the gate 23 of the n-channel MOSFET N1 and the MOSFET N1 becomes conductive. In this circuit configuration, a protection diode D1 is necessary to suppress the rise of the potential between the gate and source of the MOSFET N1. Usually, a Zener diode is used for the protection diode D1. The resistance of the resistor R2 is from several thousand ohms to several tens of thousands ohms high enough to control the charge-up speed of the gate 23 of the MOSFET N1. If one wants to accelerate the charge-up, the resistance of the resistor R2 is reduced. In some cases, no problems will be caused in the circuit, if the resistor R2 is omitted. Although no problems will be caused in the circuits of the following embodiments even when the resistor R2 is omitted, it is preferable to provide the circuits with the resistor R2 for protecting the circuits when any abnormal operation is caused in the circuits.

As explained above, the conventional independent power supply VL becomes unnecessary by connecting the p-channel MOSFET P1 with a high breakdown voltage to the output terminal 26 of the level-shift circuit 1a.

Figure 2:
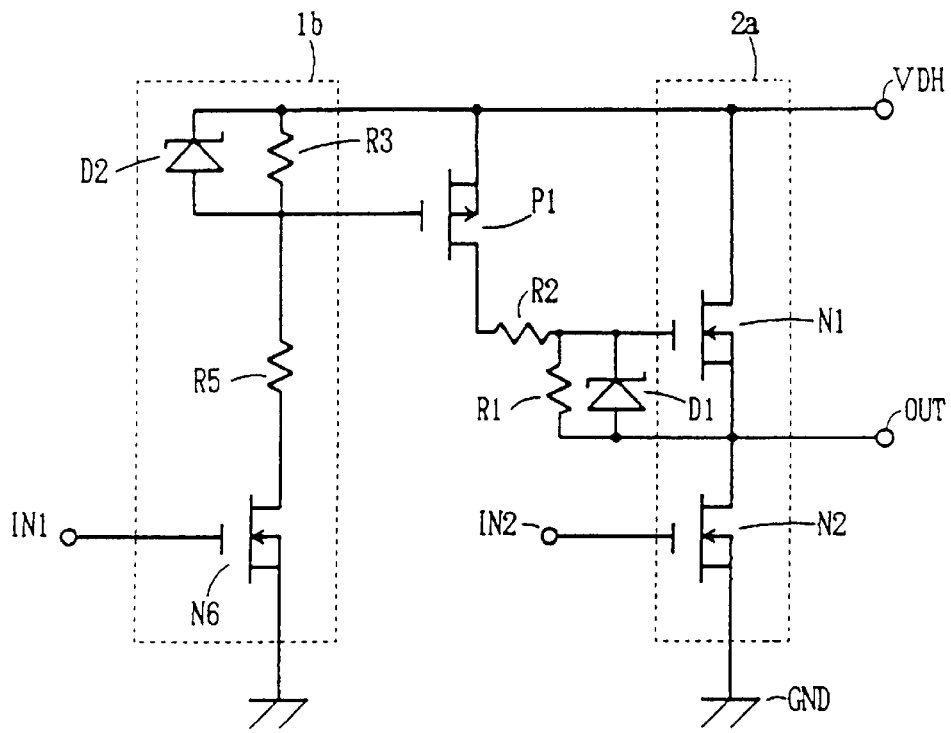
FIG. 2 is a circuit diagram of a second embodiment of an output circuit for a power IC with a high breakdown voltage according to the invention which connects a p-channel MOSFET with a high breakdown voltage to the output terminal of the level-shift circuit of resistive-potential-divider type.

FIG. 2 is a circuit diagram of a second embodiment of an output circuit for a power IC with a high breakdown voltage according to the invention which connects a p-channel MOSFET with a high breakdown voltage to the output terminal of the levelshift circuit of resistive-potential-divider type.

The output circuit of FIG. 2 is different from the output circuit of FIG. 1 in that a level-shift circuit 1b of resistive-potential-divider type drives the gate of a p-channel MOSFET P1 with a high breakdown voltage. The level-shift circuit 1b includes an n-channel MOSFET N6 with a high breakdown voltage, a resistor R3 of several tens of thousand ohms and a resistor R5 of from several K ohms to several M ohms. The resistor R5 also has a roll of controlling the current flowing through an n-channel MOSFET N6. The level-shift circuit 1b is more simplified than the level-shift circuit 1a of FIG. 1. And, the level-shift circuit 1b includes less constituent parts and devices than the level-shift circuit 1a.

The level-shift circuit 1b works as follows. A current flows through the resistor R3 when an input signal for driving an n-channel MOSFET N1 is fed to the MOSFET N6 from the input terminal IN1 of a level-shift-circuit 1b.

The p-channel MOSFET P1 is driven by the voltage drop across the resistor R3. After this, the circuit of FIG. 2 works in the same manner with the circuit of FIG. 1.

Figure 3:
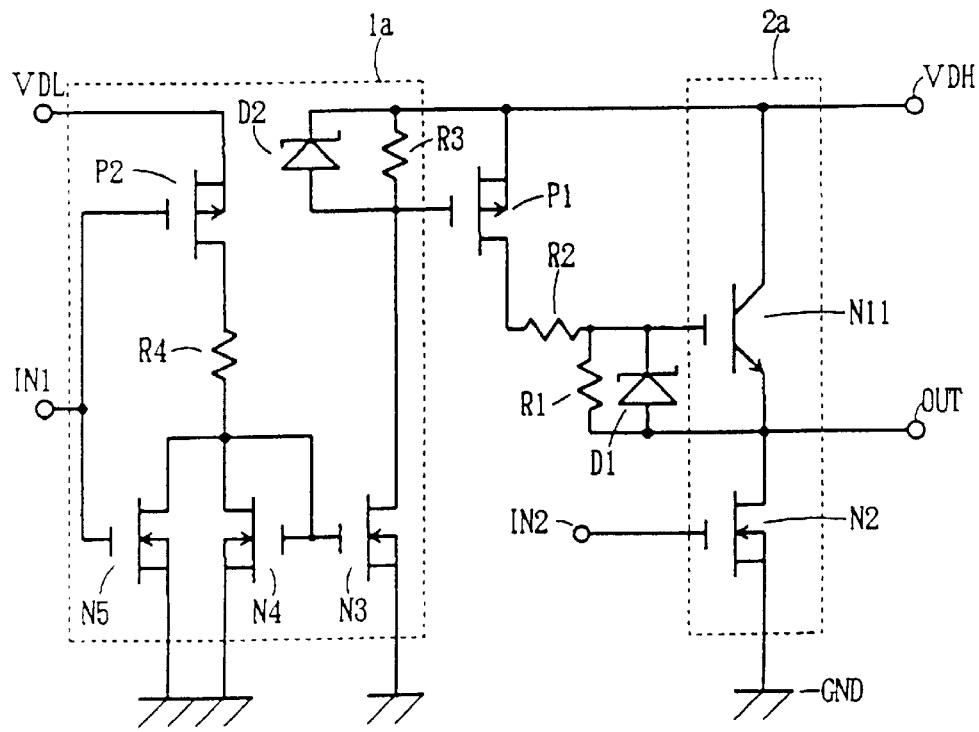
FIG. 3 is a circuit diagram of a third embodiment of an output circuit for a power IC with a high breakdown voltage according to the invention which employs an IGBT for the device on the upper arm of the totem-pole circuit of FIG. 1.

FIG. 3 is a circuit diagram of a third embodiment of an output circuit for a power IC with a high breakdown voltage according to the invention which employs an IGBT N11 for the device on the upper arm of the totem-pole circuit 2a of FIG. 1.

The output circuit of FIG. 3 works in the same manner as the circuit of FIG. 1. It is possible to use a thyristor of voltage-driven-type in substitute for the IGBT N11. The output circuit which employs a level-shift circuit 1b of resistive-potential-divider type in substitute for the level-shift circuit 1a works with no problems in the same manner with the output circuit of FIG. 2. The thyristor of voltage-driven-type or the IGBT employed in substitute for the MOSFET facilitates making a high current flow. Especially in driving the plasma display device, the magnitude of the current flowing through the upper arm and the magnitude of the current flowing through the lower arm are different. Therefore, it is quite effective to employ the IGBT or thyristor of voltage-driven-type on the arm through which a higher current flows.

Figure 4:
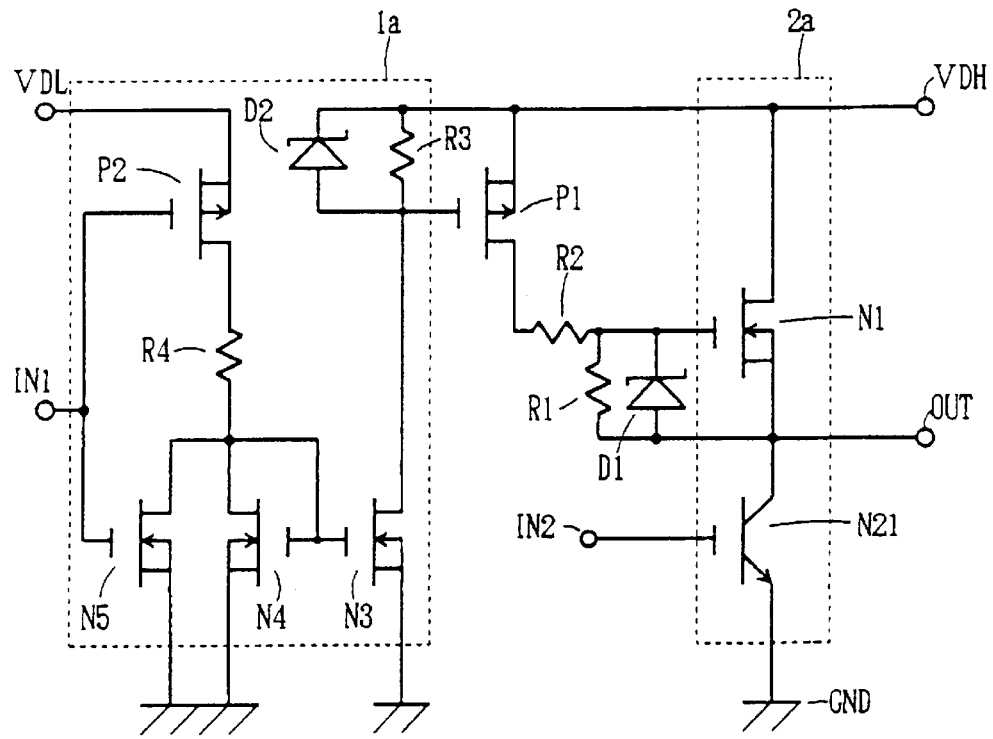
FIG. 4 is a circuit diagram of a fourth embodiment of an output circuit for a power IC with a high breakdown voltage according to the invention which employs an IGBT for the device on the lower arm of the totem-pole circuit of FIG. 1.

FIG. 4 is a circuit diagram of a fourth embodiment of an output circuit for a power IC with a high breakdown voltage according to the invention which employs an IGBT N21 for the device on the lower arm of the totem-pole circuit 2a of FIG. 1.

The output circuit of FIG. 4 works in the same manner as the circuit of FIG. 1. It is possible to use a thyristor of voltage-driven-type in substitute for the IGBT N21. Although the output circuit of FIG. 4 adopts the level-shift circuit 1a of constant-current type, the output circuit which employs a level-shift circuit 1b of resistive-potential-divider type in substitute for the level-shift circuit 1a works with no problems in the same manner with the output circuit of FIG. 2.

Figure 5:
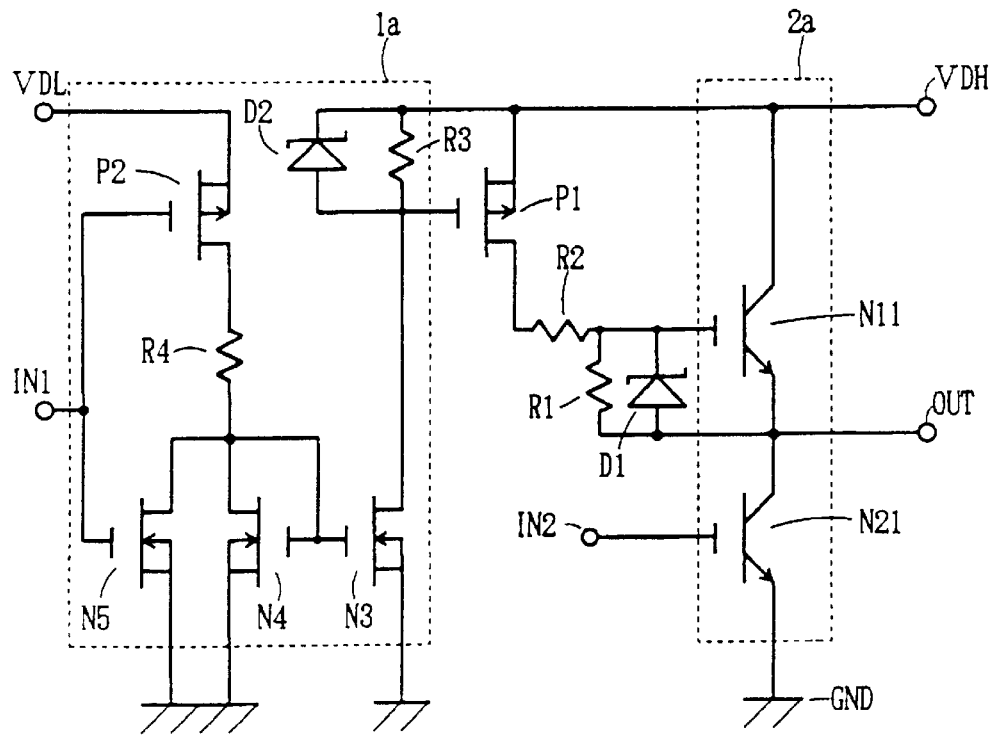
FIG. 5 is a circuit diagram of a fifth embodiment of an output circuit for a power IC with a high breakdown voltage according to the invention which employs a level-shift circuit of constant-current type and IGBT's for the respective devices on the upper and lower arms of the totem-pole circuit of FIG. 1.

FIG. 5 is a circuit diagram of a embodiment of an output circuit for a power IC with a high breakdown voltage according to the invention which employs a level-shift circuit 1a of constant-current type and IGBT's for the respective devices on the upper and lower arms of the totem-pole circuit 2a of FIG. 1.

The output circuit of FIG. 5 works in the same manner as the circuit of FIG. 1. It is possible to use thyristors of voltage-driven-type in substitute for the IGBT's. Although the output circuit of FIG. 4 adopts the level-shift circuit 1a of constant-current type, the output circuit which employs a level-shift circuit 1b of resistive-potential-divider type in substitute for the level-shift circuit I a works with no problems in the same manner with the output circuit of FIG. 2. The IGBTs adopted on the upper and lower arms facilitate increasing the current capacity. Since equal currents flow through the upper and lower arms, the output circuit of FIG. 5 is quite effective for driving a motor and such machines.

Figure 6:
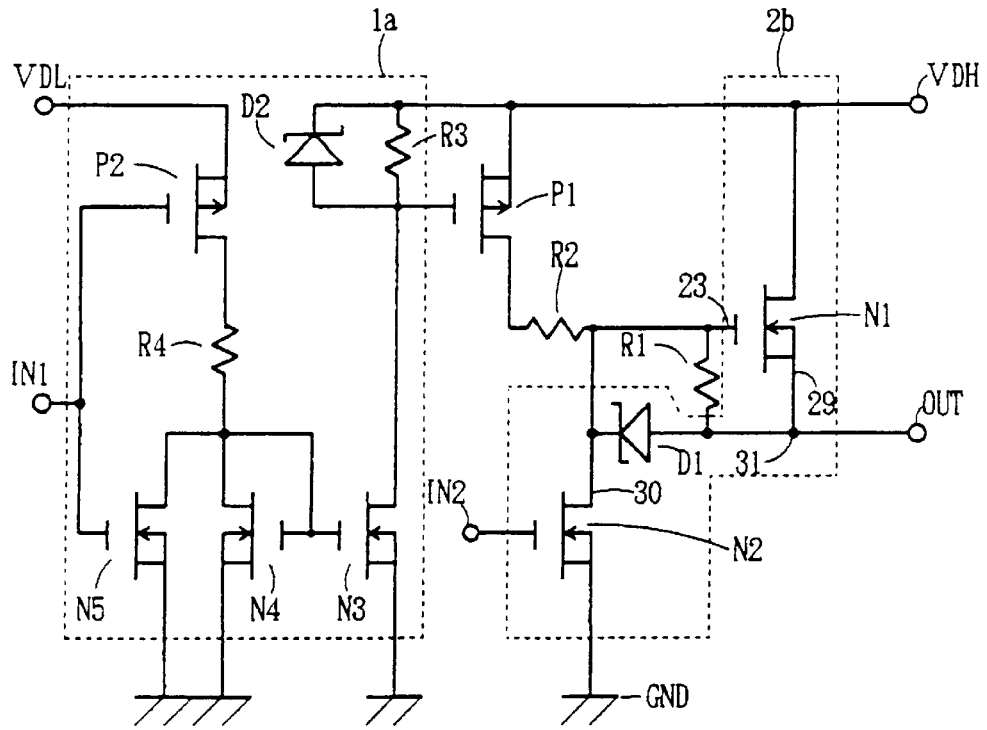
FIG. 6 is a circuit diagram of a sixth embodiment of an output circuit for a power IC with a high breakdown voltage according to the invention which facilitates preventing arm-short-circuit from causing.

FIG. 6 is a circuit diagram of a sixth embodiment of an output circuit for a power IC with a high breakdown voltage according to the invention which facilitates preventing arm-short-circuit from causing.

Referring now to FIG. 6, the output circuit includes a totem-pole circuit 2b which includes an n-channel MOSFET N1 with a high breakdown voltage on the upper arm, an n-channel MOSFET N2 with a high breakdown voltage on the lower arm and a diode D1 between the MOSFET's N1 and N2. The drain 30 of the MOSFET N2 is connected with the gate 23 of the MOSFET N1 . The diode D1 is inserted between the drain 30 of the MOSFET N2 and the source 29 of the MOSFET N1. The connection point 31 of the diode D1 and the source 29 of the MOSFET N1 is connected to an output terminal OUT. Due to the circuit configuration described above, the current flowing through the MOSFET N2 when the MOSFET N2 is turned on flows through the diode D1. The gate potential of the MOSFET N1 is lower than source potential thereof by the forward voltage drop across the diode D1. Therefore, while the MOSFET N2 is in the on-state thereof, the MOSFET N1 will never be turned on. In other words, the arm-short-circuit is prevented from causing without fail. By building the diode D1 and the MOSFET N2 in a semiconductor substrate, an IGBT is formed. By forming such an IGBT, the current driving capability of the lower arm is more improved as compared with the MOSFET N2 formed separately. The operation of the MOSFET N1 on the upper arm in FIG. 6 is same with that in FIG. 1.

Figure 7:
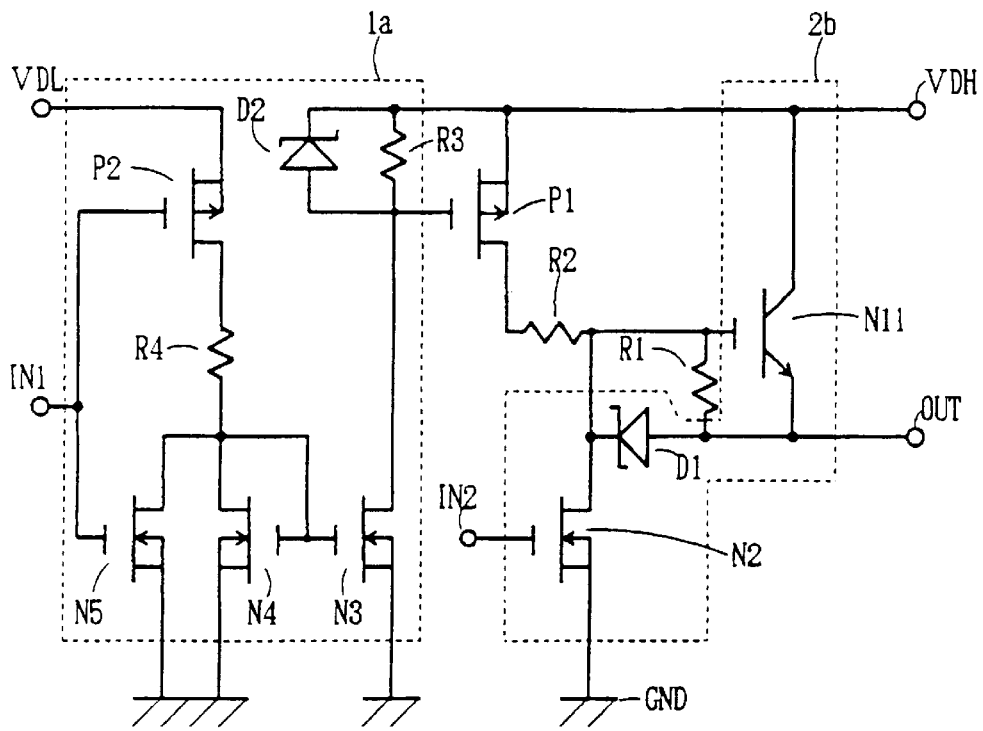
FIG. 7 is a circuit diagram of a seventh embodiment of an output circuit for a power IC with a high breakdown voltage according to the invention which substitutes an IGBT for the on the upper arm of FIG. 6.

FIG. 7 is a circuit diagram of a seventh embodiment of an output circuit for a power IC with a high breakdown voltage according to the invention which substitutes an IGBT N11 for the MOSFET N1 on the upper arm of FIG. 6. The output circuit of FIG. 7 works in the same manner as the output circuit of FIG. 6. Thyristors of voltage-driven-type may be used in substitute for the IGBT's to increase the current capacity.

Figure 8:
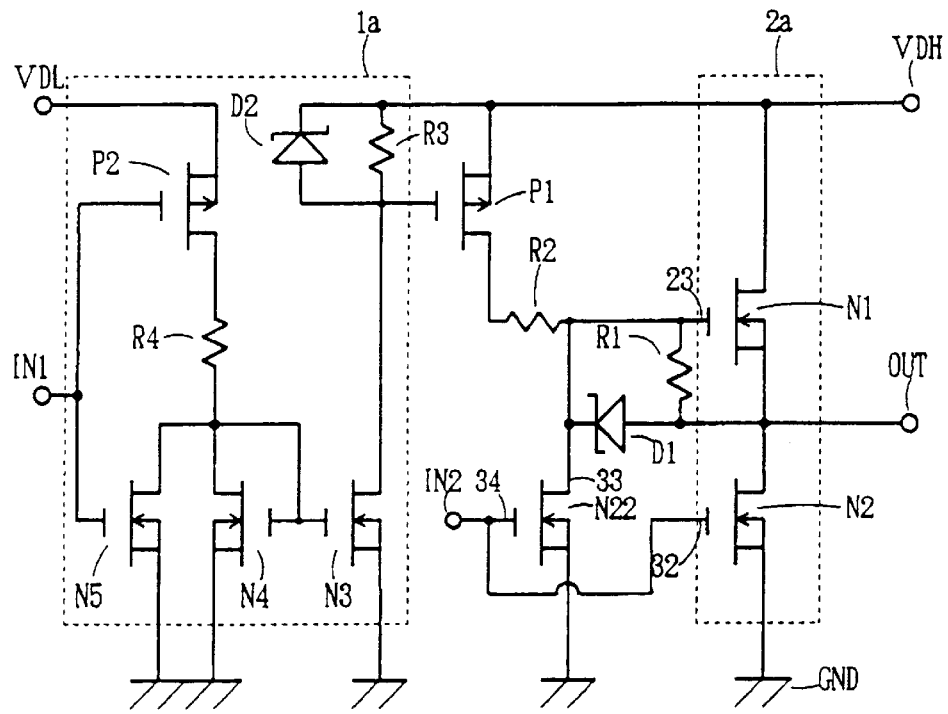
FIG. 8 is a circuit diagram of an eighth embodiment of an output circuit for a power IC with a high breakdown voltage according to the invention which connects a device for preventing arm-short-circuit in parallel to an n-channel MOSFET with a high breakdown voltage on the low potential side of the totem pole circuit.

FIG. 8 is a circuit diagram of an eighth embodiment of an output circuit for a power IC with a high breakdown voltage according to the invention which connects a device for preventing arm-short-circuit in parallel to an n-channel MOSFET N2 with a high breakdown voltage on the low potential side of the totem pole circuit.

Referring now to FIG. 8, the device for preventing arm-short-circuit is a first auxiliary n-channel MOSFET N22 with a high breakdown voltage. The drain 33 of the MOSFET N22 is connected to the gate 23 of an n-channel MOSFET N1 with a high breakdown voltage on the upper arm of the totem pole circuit. The gate 34 of the MOSFET N22 is connected to the gate 32 of the MOSFET N2 on the lower arm of the totem pole circuit. Since the MOSFET N22 executes switching in synchronism with the MOSFET N2, the output circuit of FIG. 8 executes short-circuit protection in the same manner as the output circuit of FIG. 6. Since it is not necessary to make a high current flow through the MOSFET N22, the device area for the MOSFET N22 may be smaller than the device area for the MOSFET N2. The MOSFET N1 in FIG. 8 works in the same manner as in FIG. 1.

Figure 9:
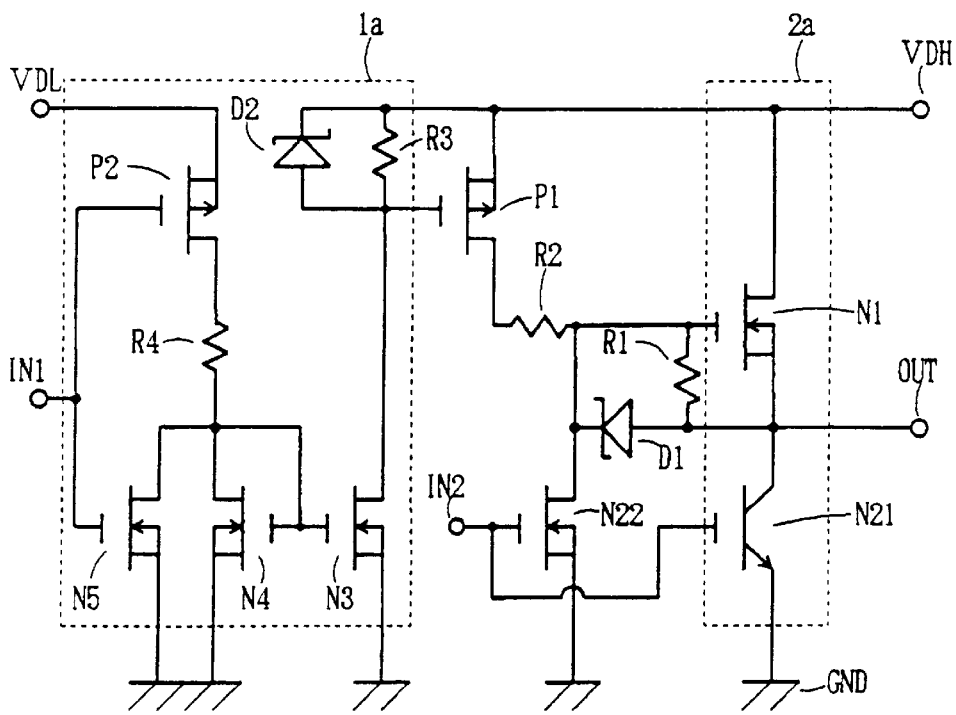
FIG. 9 is a circuit diagram of a ninth embodiment of an output circuit for a power IC with a high breakdown voltage according to the invention which employs an IGBT in substitute for the n-channel MOSFET on the lower arm of the totem pole circuit of FIG. 8.

FIG. 9 is a circuit diagram of a ninth embodiment of an output circuit for a power IC with a high breakdown voltage according to the invention which employs an IGBT N21 in substitute for the n-channel MOSFET N2 on the lower arm of the totem pole circuit of FIG. 8.

The output circuit of FIG. 9 works in the same manner as the output circuit of FIG. 8. It is possible to employ a thyristor of voltage-driven-type and such a device in substitute for the IGBT N21.

Figure 10:
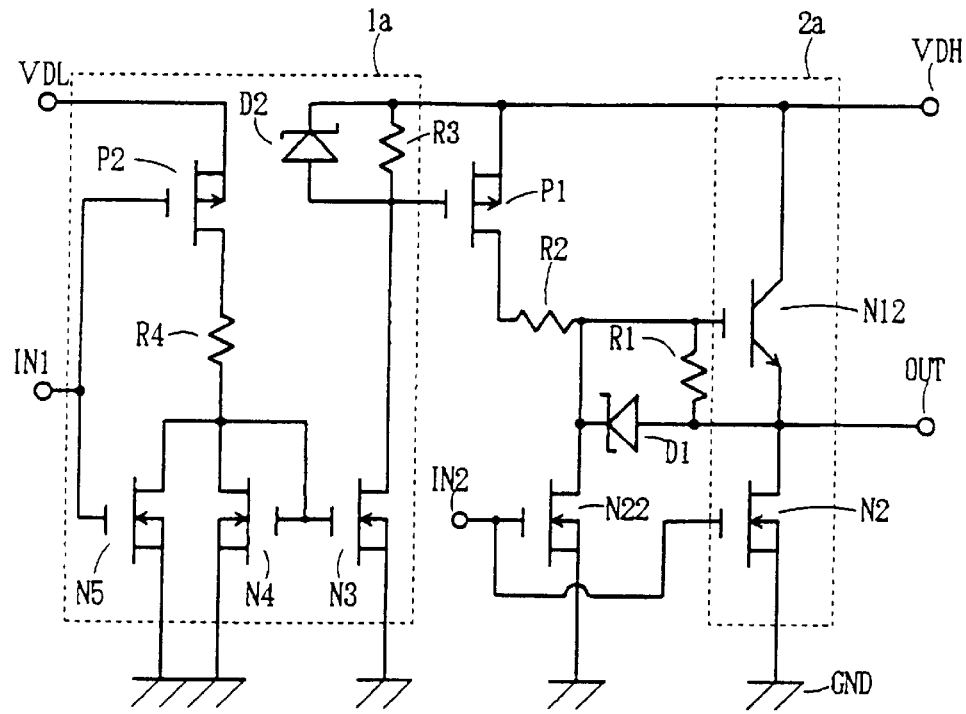
FIG. 10 is a circuit diagram of a tenth embodiment of an output circuit for a power IC with a high breakdown voltage according to the invention which employs an IGBT in substitution for the n-channel MOSFET on the upper arm of the totem pole circuit of FIG. 8.

FIG. 10 is a circuit diagram of a tenth embodiment of an output circuit for a power IC with a high breakdown voltage according to the invention which employs an IGBT N12 in substitute for the n-channel MOSFET N1 on the upper arm of the totem pole circuit of FIG. 8.

The output circuit of FIG. 10 works in the same manner as the output circuit of FIG. 8. It is possible to employ a thyristor of voltage-driven-type and such a device in substitute for the IGBT N12.

Figure 11:
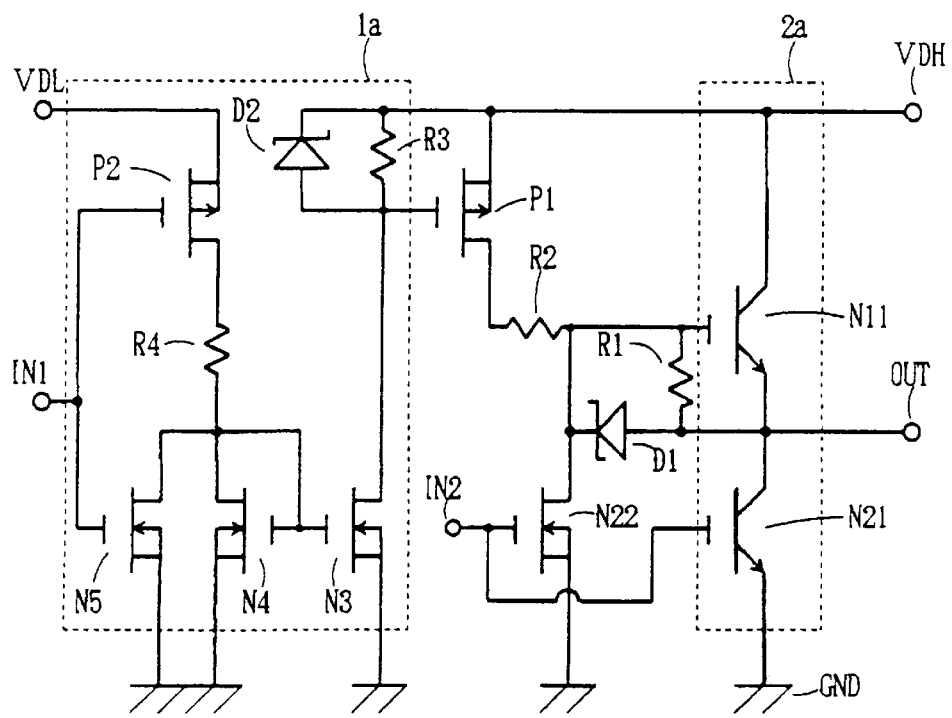
FIG. 11 is a circuit diagram of an eleventh embodiment of an output circuit for a power IC with a high breakdown voltage according to the Invention which employs an IGBT in substitute for the n-channel MOSFET an the upper arm of the totem pole circuit of FIG. 9.

FIG. 11 is a circuit diagram of an eleventh embodiment of an output circuit for a power IC with a high breakdown voltage according to the invention which employs an IGBT N11 in substitute for the n-channel MOSFET N1 on the upper arm of the totem-pole circuit of FIG. 9.

The output circuit of FIG. 11 works in the same manner as the output circuit of FIG. 8. It is possible to employ a thyristor of voltage-driven-type and such a device in substitute for the IGBT N11.

Figure 12:
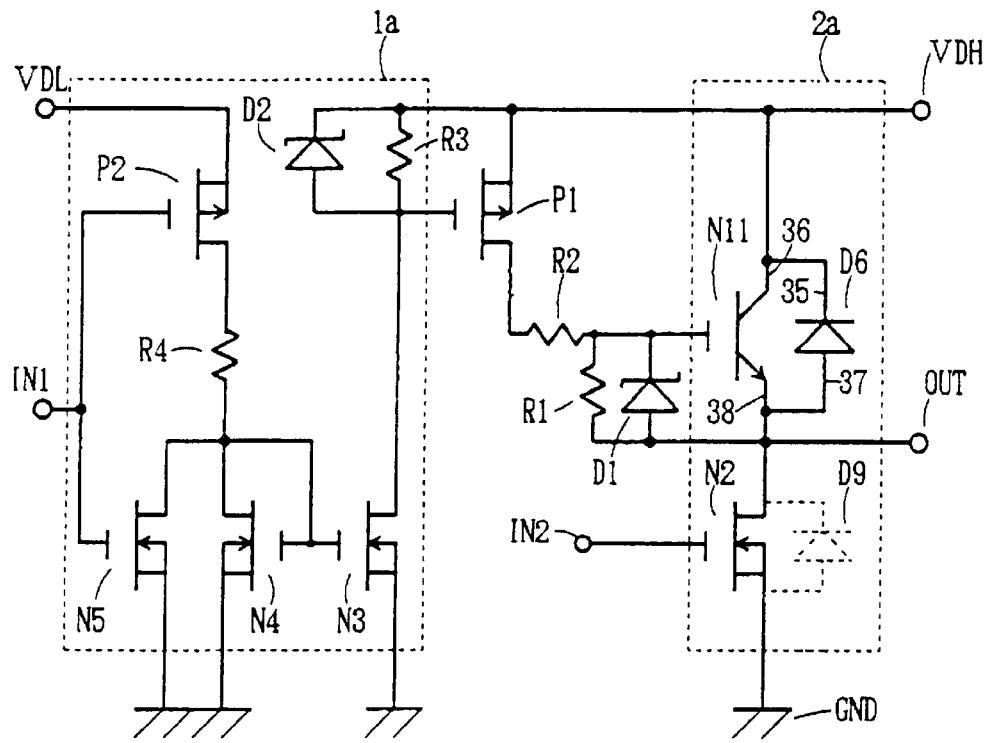
FIG. 12 is a circuit diagram of a twelfth embodiment of an output circuit for a power IC with a high breakdown voltage according to the invention which connects a free-wheeling diode for making a reverse current flow in parallel to the IGBT on the upper arm of the totem-pole circuit of FIG. 3.

FIG. 12 is a circuit diagram of a twelfth embodiment of an output circuit for a power IC with a high breakdown voltage according to the invention which connects a free-wheeling diode D6 for making a reverse current flow in parallel to the IGBT N11 on the upper arm of the totem-pole circuit 2a of FIG. 3.

Referring now to FIG. 12, the cathode 35 of the free-wheeling diode D6 is connected to the collector 36 of the IGBT N11 and the anode 37 of the free-wheeling diode D6 is connected to the emitter 38 of the IGBT N11. It is not necessary to connect another free-wheeling diode in parallel to the MOSFET N2 with a high breakdown voltage on the lower arm of the totem-pole circuit 2a, since a reverse current may flow through a parasitic diode D9, shown in FIG. 12 with dotted lines, of the MOSFET N2.

Figure 13:
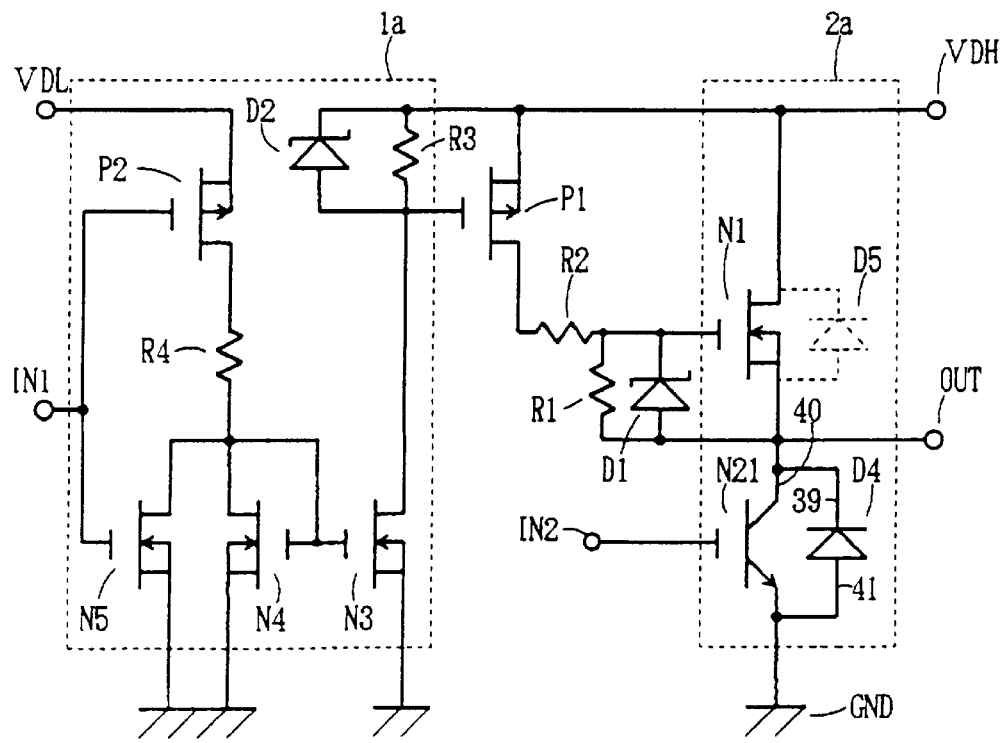
FIG. 13 is a circuit diagram of a thirteenth embodiment of an output circuit for a power IC with a hi breakdown voltage according to the invention which connects a free-wheeling diode for making a reverse current flow in parallel to the IGBT on the lower arm of the totem-pole circuit of FIG. 4.

FIG. 13 is a circuit diagram of a thirteenth embodiment of an output circuit for a power IC with a high breakdown voltage according to the invention which connects a free-wheeling diode D4 for making a reverse current flow in parallel to the IGBT N21 on the lower arm of the totem-pole circuit 2a of FIG. 4.

Referring now to FIG. 13, the cathode 39 of the free-wheeling diode D4 is connected to the collector 40 of the IGBT N21 and the anode 41 of the freewheeling diode D4 is connected to the emitter 42 of the IGBT N21. It is not necessary to connect another free-wheeling diode in parallel to the MOSFET N1 with a high breakdown voltage on the upper arm of the totem-pole circuit 2a, since a reverse current may flow through a parasitic diode D5, shown in FIG. 13 with dotted lines, of the MOSFET N1.

Figure 14:
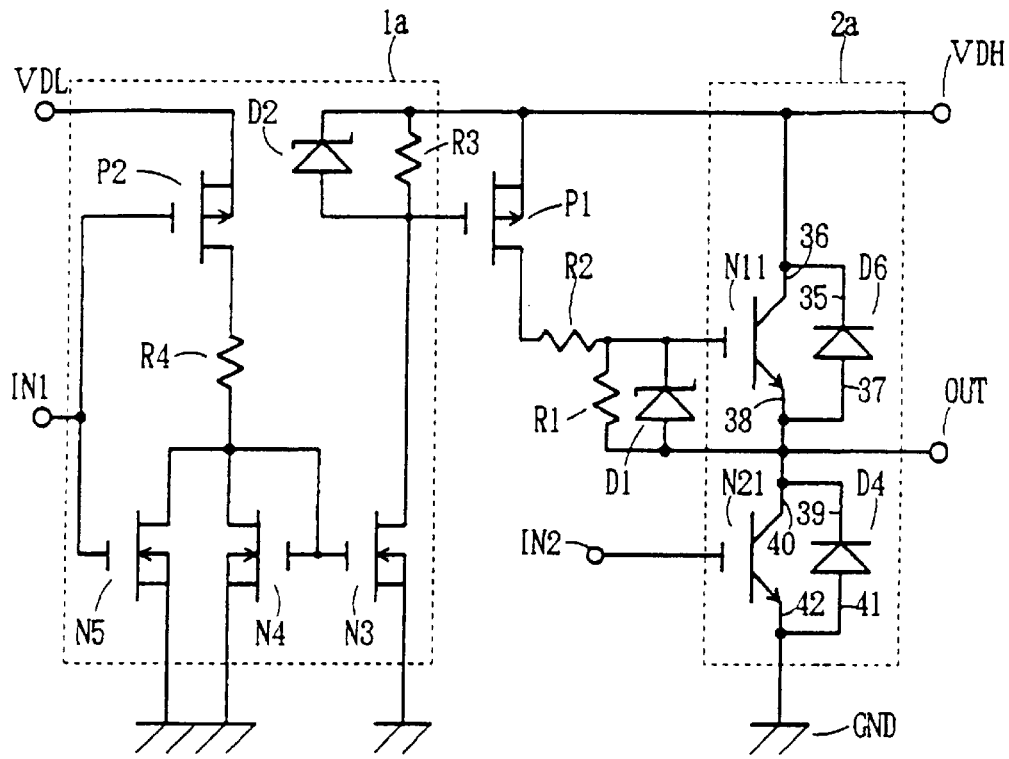
FIG. 14 is a circuit diagram of a fourteenth embodiment of an output circuit for a power IC with a high breakdown voltage according to the invention which connects freewheeling diodes in parallel to the IGBT's, respectively, on the upper and lower arms of the totem-pole circuit of FIG. 5.

FIG. 14 is a circuit diagram of a fourteenth embodiment of an output circuit for a power IC with a high breakdown voltage according to the invention which connects free-wheeling diodes D6 and D4 in parallel to the IGBT's N11 and N21, respectively, on the upper and lower arms of the totem-pole circuit 2a of FIG. 5.

Referring now to FIG. 14, the cathode 35 of the free-wheeling diode D6 is connected to the collector 36 of the IGBT N11 and the anode 37 of the free-wheeling diode D6 is connected to the emitter 38 of the IGBT N1. The cathode 39 of the free-wheeling diode D4 is connected to the collector 40 of the IGBT N21 and the anode 41 of the free-wheeling diode D4 is connected to the emitter 42 of the IGBT N21.

Figure 15:
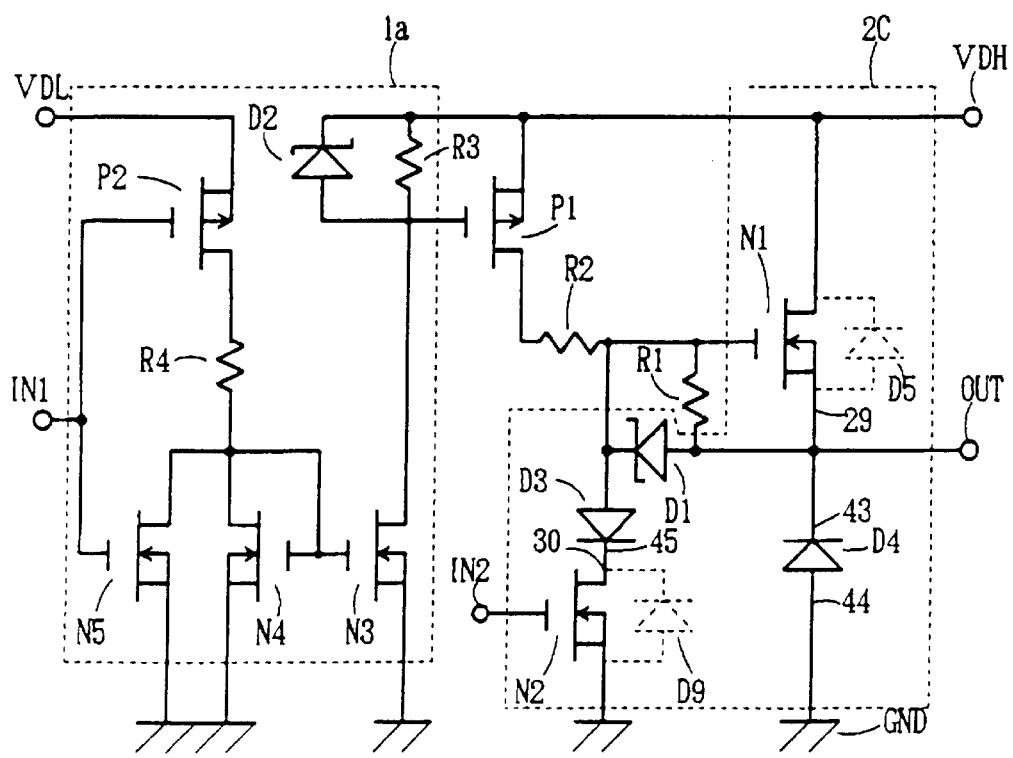
FIG. 15 is a circuit diagram of a tenth embodiment of an output circuit for a power IC with a high breakdown voltage according to the invention which arranges a diode with a high breakdown voltage for making a reverse current flow on the lower arm of the totem-pole circuit of FIG. 6.

FIG. 15 is a circuit diagram of a fifteenth embodiment of an output circuit for a power IC with a high breakdown voltage according to the invention which arranges a diode with a high breakdown voltage for making a reverse current flow on the lower arm of the totem-pole circuit 2a of FIG. 6.

Referring now to FIG. 15, the cathode 43 of a second auxiliary diode D4 with a high breakdown voltage is connected to the source 29 of the n-channel MOSFET N1 on the upper arm and the anode 44 of the second auxiliary diode D4 is connected to the earth GND.

To interrupt the current which flows from the earth GND to the high potential side of the high-voltage power supply VDH through the parasitic diode D9 of the n-channel MOSFET N2 on the lower arm, the cathode 45 of a first auxiliary diode D3 is connected to the drain 30 of the MOSFET N2 and the auxiliary diode D3 and the MOSFET N2 are connected in series. It is not necessary to arrange another free-wheeling diode on the upper arm of the totem-pole circuit 2a, since a reverse current may flow through the parasitic diode D5 of the MOSFET N1.

Figure 16:
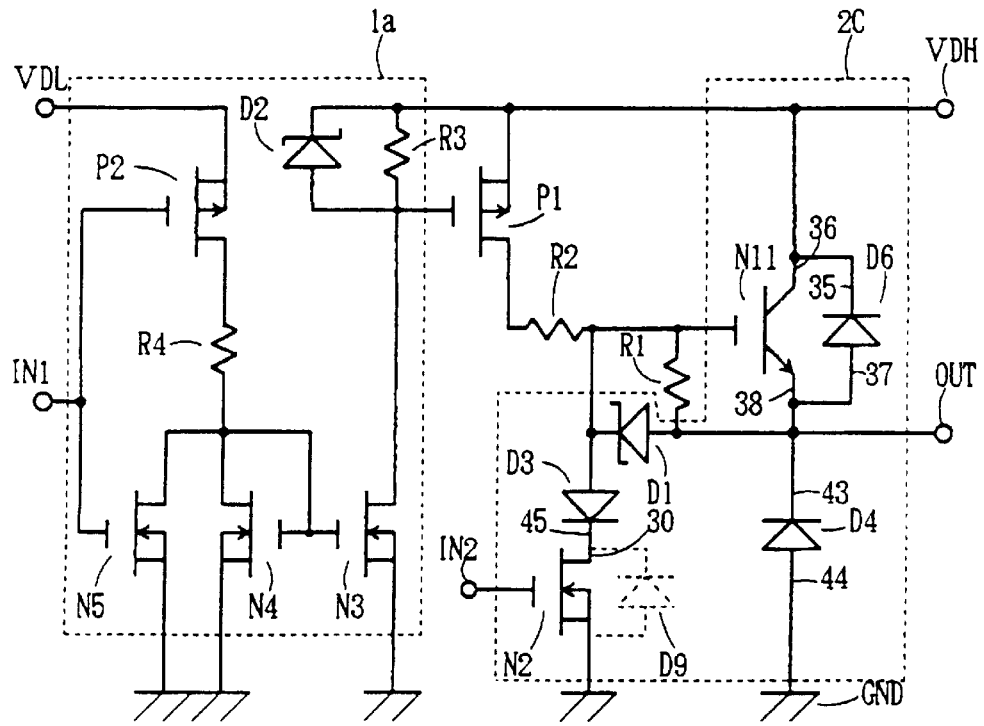
FIG. 16 is a circuit diagram of a sixteenth embodiment of an output circuit for a power IC with a high breakdown voltage according to the invention which arranges diodes with a high breakdown voltage for making reverse currents flow on the upper and lower arms of the totem-pole circuit of FIG. 7.

FIG. 16 is a circuit diagram of a sixteenth embodiment of an output circuit for a power IC with a high breakdown voltage according to the invention which arranges diodes with a high breakdown voltage for making reverse currents flow on the upper and lower arms of the totem-pole circuit 2a of FIG. 7.

Referring now to FIG. 16, the cathode 35 of a free-wheeling diode D6 is connected to the collector 36 of the IGBT N11 on the upper arm and the anode 37 of the diode D6 is connected to the emitter 38 of the IGBT N11. The cathode 43 of a second auxiliary diode D4 on the lower arm is connected to the emitter 38 of the IGBT N11 on the upper arm and the anode 44 of the second auxiliary diode D4 is connected to the earth GND. To interrupt the current which flows from the earth GND to the high potential side of the high-voltage power supply VDH through the parasitic diode D9 of the n-channel MOSFET N2 on the lower arm, the cathode 45 of a first auxiliary diode D3 is connected to the drain 30 of the MOSFET N2, and the auxiliary diode D3 and the MOSFET N2 are connected in series.

Figure 17:
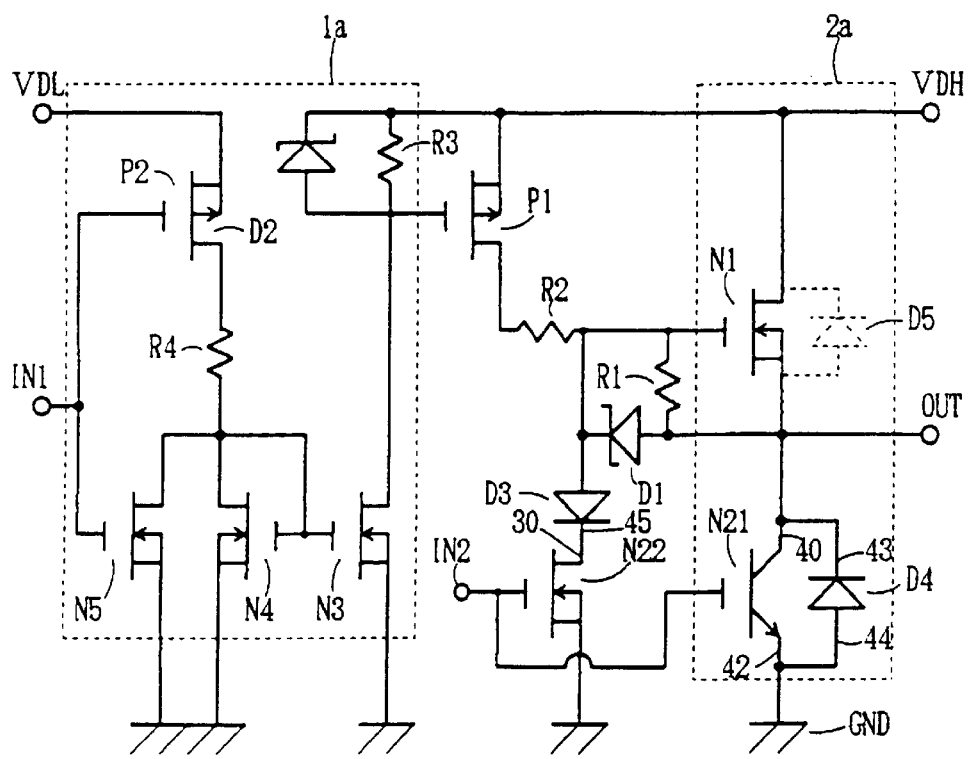
FIG. 17 is a circuit diagram of a seventeenth embodiment of an output circuit for a power IC with a high breakdown voltage according to the invention which connects a freewheeling diode for making a reverse current flow in parallel to the IGBT on the lower arm of the totem-pole circuit of FIG. 9.

FIG. 17 is a circuit diagram of a seventeenth embodiment of an output circuit for a power IC with a high breakdown voltage according to the invention which connects a free-wheeling diode D4 for making a reverse current flow in parallel to the IGBT N21 on the lower arm of the totem-pole circuit 2a of FIG. 9.

Referring now to FIG. 17, the cathode 43 of the free-wheeling diode D4 is connected to the collector 40 of the IGBT N21 and the anode 44 of the free-wheeling diode D4 is connected to the emitter 42 of the IGBT N21. To interrupt the current which flows from the earth GND to the high potential side of the high-voltage power supply VDH through the parasitic diode of a first auxiliary n-channel MOSFET N22 with a high breakdown voltage on the lower arm, the cathode 45 of a first auxiliary diode D3 is connected to the drain 30 of the MOSFET N22, and the auxiliary diode D3 and the MOSFET N22 are connected in series. It is not necessary to arrange another free-wheeling diode on the upper arm of the totem-pole circuit 2a, since a reverse current may flow through the parasitic diode D5 of the MOSFET N1.

Figure 18:
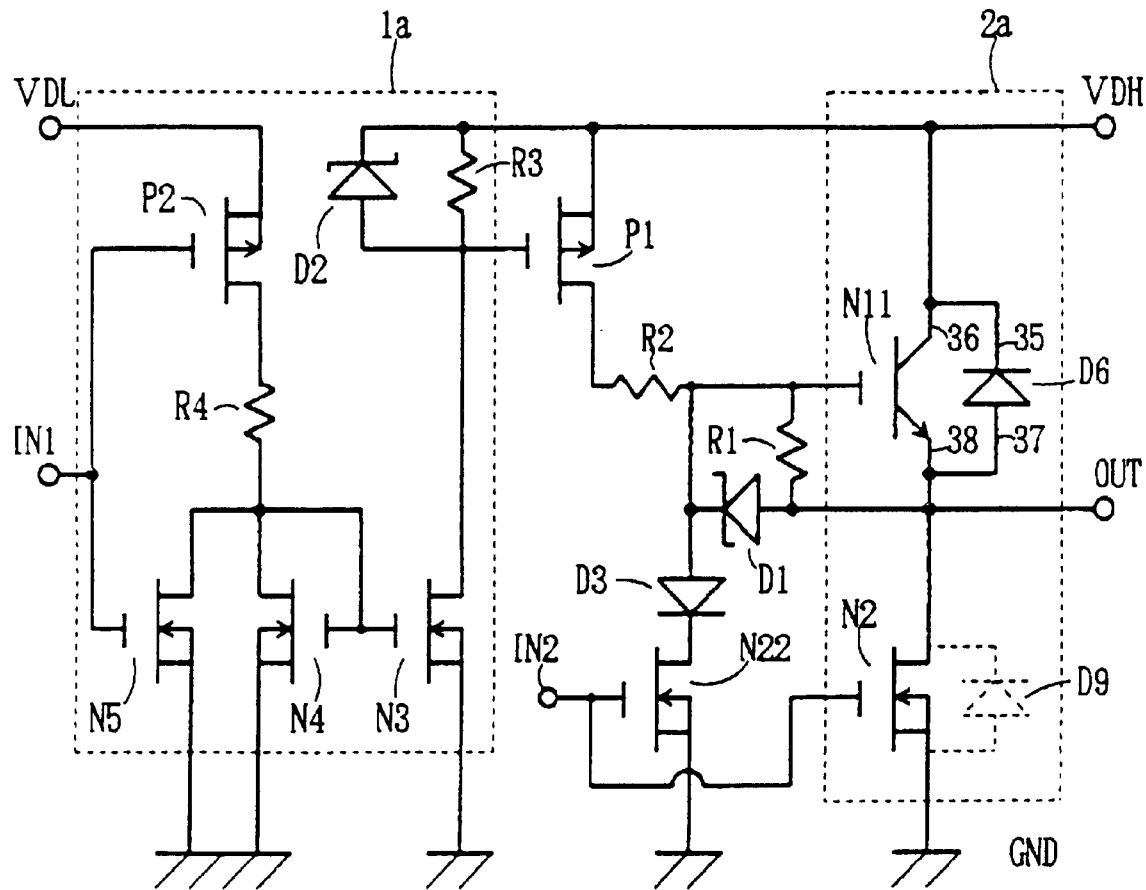
FIG. 18 is a circuit diagram of an eighteenth embodiment of an output circuit for a power IC with a high breakdown voltage according to the invention which connects a freewheeling diode for making a reverse current flow in parallel to the IGBT on the lower arm of the totem-pole circuit of FIG. 11.

FIG. 18 is a circuit diagram of an eighteenth embodiment of an output circuit for a power IC with a high breakdown voltage according to the invention which connects a free-wheeling diode D6 for making a reverse current flow in parallel to the IGBT N11 on the lower arm of the totem-pole circuit 2a of FIG. 10.

Figure 19:
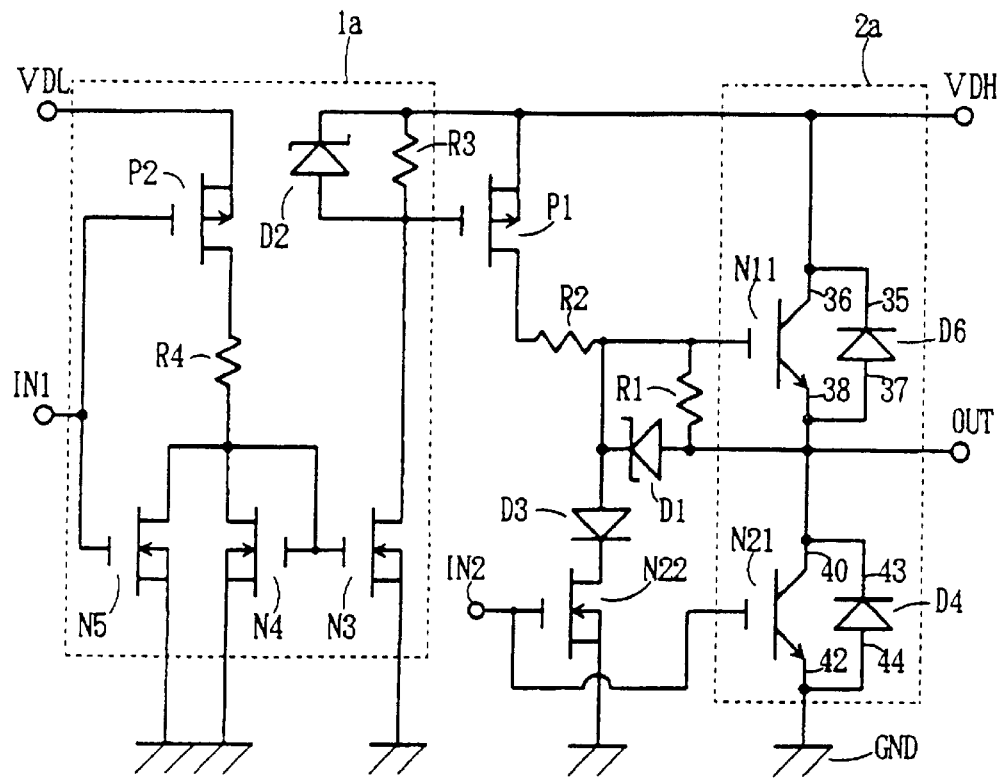
FIG. 19 is a circuit diagram of a nineteenth embodiment of an output circuit for a power IC with a high breakdown voltage according to the invention which connects freewheeling diodes in parallel to the IGBT's on the upper and lower arms of the totem-pole circuit of FIG. 11.

Referring now to FIG. 18, the cathode 35 of the free-wheeling diode D6 is connected to the collector 36 of the IGBT N11. The anode 37 of the freewheeling diode D6 is connected to the emitter 38 of the IGBT N11. To interrupt the current which flows from the earth GND to the high potential side of the high-voltage power supply VDH through the parasitic diode of a first auxiliary n-channel MOSFET N22 with a high breakdown voltage on the lower arm, a first auxiliary diode D3 and the MOSFET N22 are connected in series. It is not necessary to arrange another free-wheeling diode on the lower arm of the totem-pole circuit 2a, since a reverse current may flow through the parasitic diode D9 of the MOSFET N2. FIG. 19 is a circuit diagram of a nineteenth embodiment of an output circuit for a power IC with a high breakdown voltage according to the invention which connects free-wheeling diodes D6 and D4 in parallel to the IGBTs N11 and N21, respectively, on the upper and lower arms of the totem-pole circuit 2a of FIG. 11.

Referring now to FIG. 19, the cathode 35 of the free-wheeling diode D6 is connected to the collector 36 of the IGBT N11 on the upper arm and the anode 37 of the free-wheeling diode D6 is connected to the emitter 38 of the IGBT N11. The cathode 43 of the free-wheeling diode D4 is connected to the collector 40 of the IGBT N21 on the lower arm and the anode 44 of the free-wheeling diode D4 is connected to the emitter 42 of the IGBT N21. To interrupt the current which flows from the earth GND to the high potential side of the high-voltage power supply VDH through the parasitic diode of a first auxiliary n-channel MOSFET N22 with a high breakdown voltage on the lower arm, a first auxiliary diode D3 is connected in series with the MOSFET N22

Figure 20:
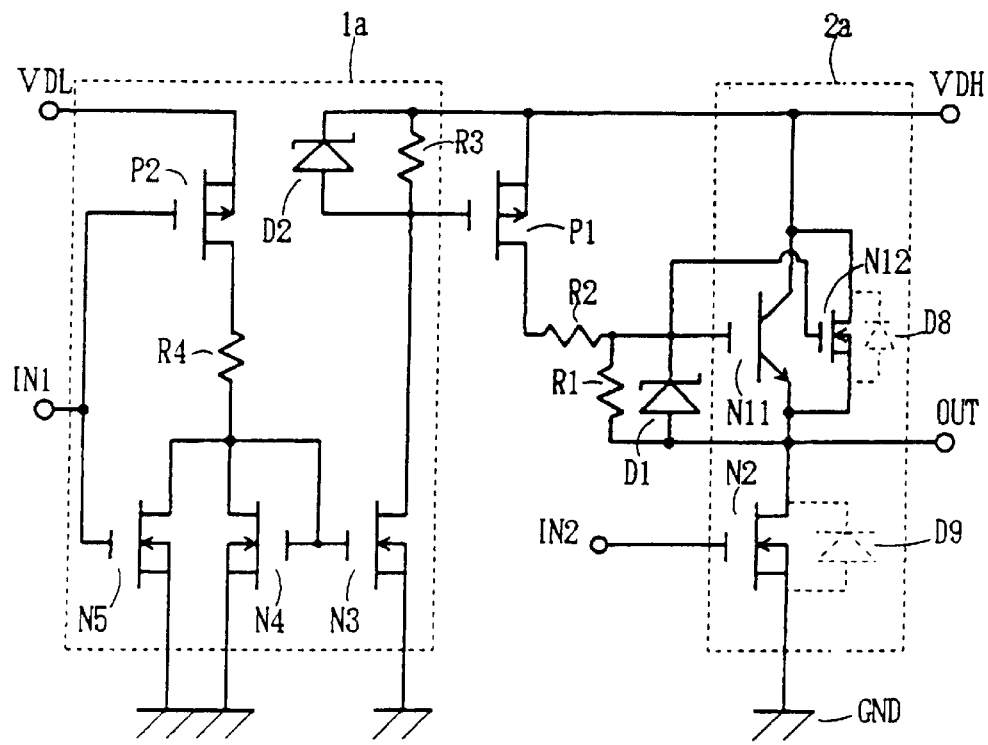
FIG. 20 is a circuit diagram of a twentieth embodiment of an output circuit for a power IC with a high breakdown voltage according to the invention which connects a second auxiliary n-channel MOSFET with a high breakdown voltage in substitute for the free-wheeling diode on the upper arm of the totem-pole circuit of FIG. 12.

FIG. 20 is a circuit diagram of a twentieth embodiment of an output circuit for a power IC with a high breakdown voltage according to the invention which connects a second auxiliary n-channel MOSFET N12 with a high breakdown voltage in substitute for the free-wheeling diode D6 on the upper arm of the totem-pole circuit 2a of FIG. 12.

Referring now to FIG. 20, since a reverse current is made to flow through the parasitic diode D8 of the second auxiliary MOSFET N12 and since a forward current is made to flow through the IGBT N11 and the MOSFET N12 in the forward conduction, the current conduction capability of the totem-pole circuit of FIG. 20 is higher than that of FIG. 19 which arranges the free-wheeling diode D6 on the upper arm. It is not necessary to arrange another free-wheeling diode on the lower arm of the totem-pole circuit 2a, since a reverse current may flow through the parasitic diode D9 of the MOSFET N2.

Figure 21:
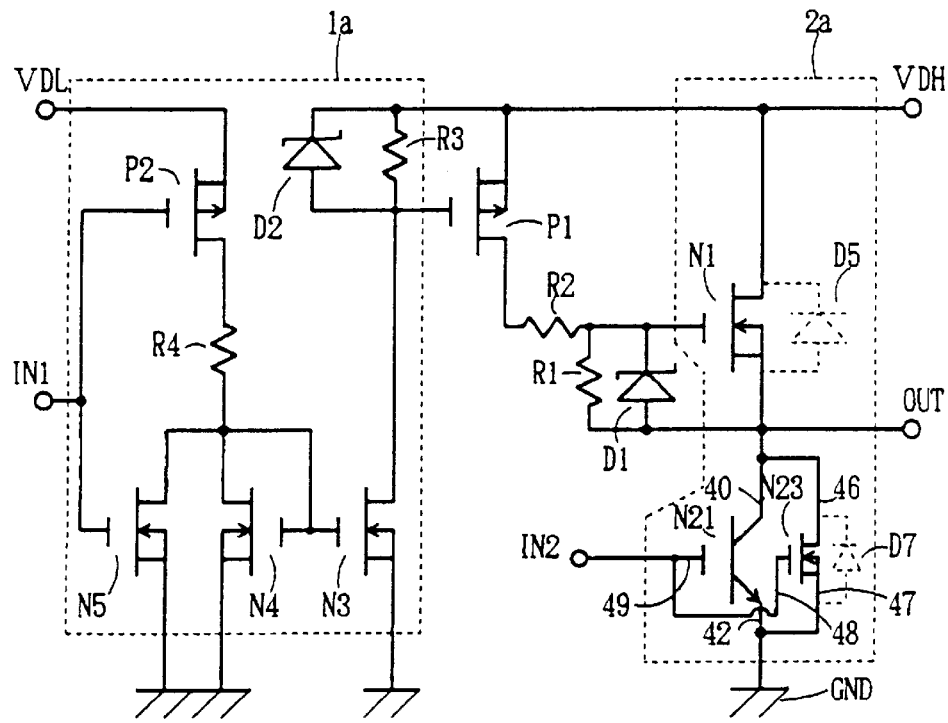
FIG. 21 is a circuit diagram of a twenty first embodiment of an output circuit for a power IC with a high breakdown voltage according to the invention which connects a second auxiliary n-channel MOSFET with a high breakdown voltage in substitute for the freewheeling diode on the lower arm of the totem-pole circuit of FIG. 13.

FIG. 21 is a circuit diagram of a twenty first embodiment of an output circuit for a power IC with a high breakdown voltage according to the invention which connects a second auxiliary n-channel MOSFET N23 with a high breakdown voltage in substitute for the free-wheeling diode D4 on the lower arm of the totem-pole circuit 2a of FIG. 13.

Referring now to FIG. 21, a reverse current on the lower arm is made to flow through the parasitic diode D7 of the second auxiliary MOSFET N23. The drain 46, source 47 and gate 48 of the MOSFET N23 are connected to the collector 40, emitter 42 and gate 49 of the IGBT N21 on the lower arm. Since the MOSFET N23 and IGBT N21 operate in synchronism with each other due to the above described circuit connection, the current carrying capability of the totem-pole circuit of FIG. 20 in the forward conduction is higher than that of FIG. 19 which arranges the freewheeling diode D4 on the lower arm. It is not necessary to arrange another freewheeling diode on the upper arm of the totem-pole circuit 2a, since a reverse current may flow through the parasitic diode D5 of the MOSFET N1.

Figure 22:
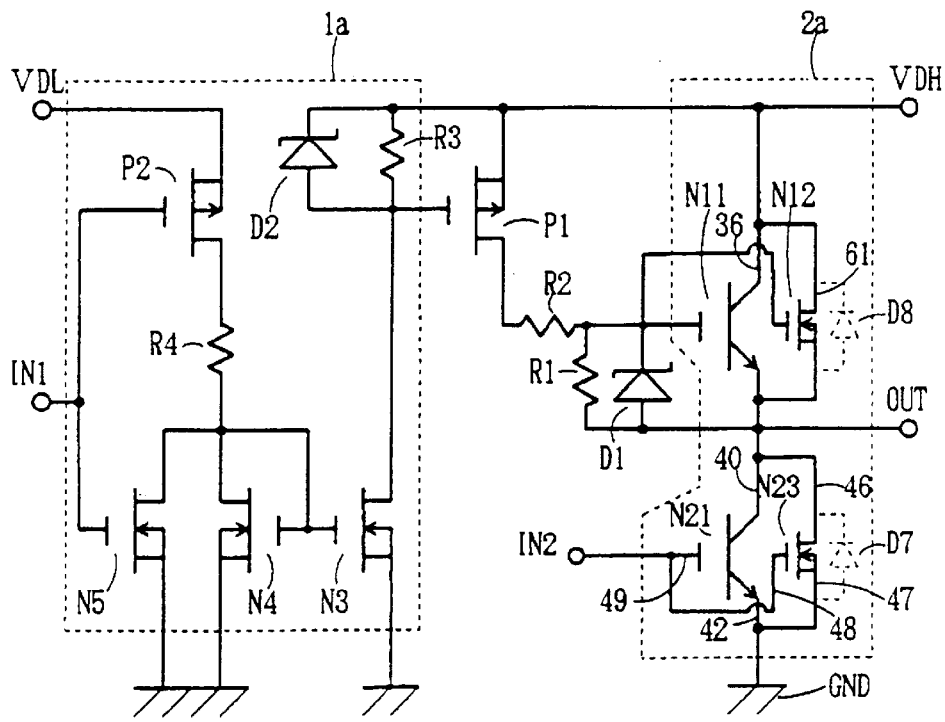
FIG. 22 is a circuit diagram of a twenty second embodiment of an output circuit for a power IC with a high breakdown voltage according to the invention which connects second auxiliary n-channel MOSFET's in substitute for the respective freewheeling diodes on the upper and lower arms of the totem-pole circuit of FIG. 14.

FIG. 22 is a circuit diagram of a twenty second embodiment of an output circuit for a power IC with a high breakdown voltage according to the invention which connects second auxiliary n-channel MOSFET's N12 and N23 in substitute for the respective free-wheeling diodes D6 and D4 on the upper and lower arms of the totem-pole circuit 2a of FIG. 14.

Referring now to FIG. 22, the reverse current on the upper arm is made flow through the parasitic diode D8 of the second auxiliary MOSFET N12 and the reverse current on the lower arm is made flow through the parasitic diode D7 of the second auxiliary MOSFET N23.

The drain 61 of the MOSFET N12 is connected to the collector 36 of the IGBT N11 on the upper arm of the totem-pole circuit 2a. Since the MOSFET N12 operates in synchronism with the IGBT N11 on the upper arm, the current carrying capability of the upper arm in the forward conduction is higher than that of the circuit configuration which arranges the free-wheeling diode D6 on the upper arm.

The drain 46, source 47 and gate 48 of the MOSFET N23 are connected to the collector 40, emitter 42 and gate 49 of the IGBT N21 on the lower arm. Since the MOSFET N23 and IGBT N21 operate in synchronism with each other due to the above described circuit connection, the current carrying capability of the lower arm in the forward conduction is higher than that of the circuit configuration which arranges the free-wheeling diode D4 on the lower arm.

Figure 23:
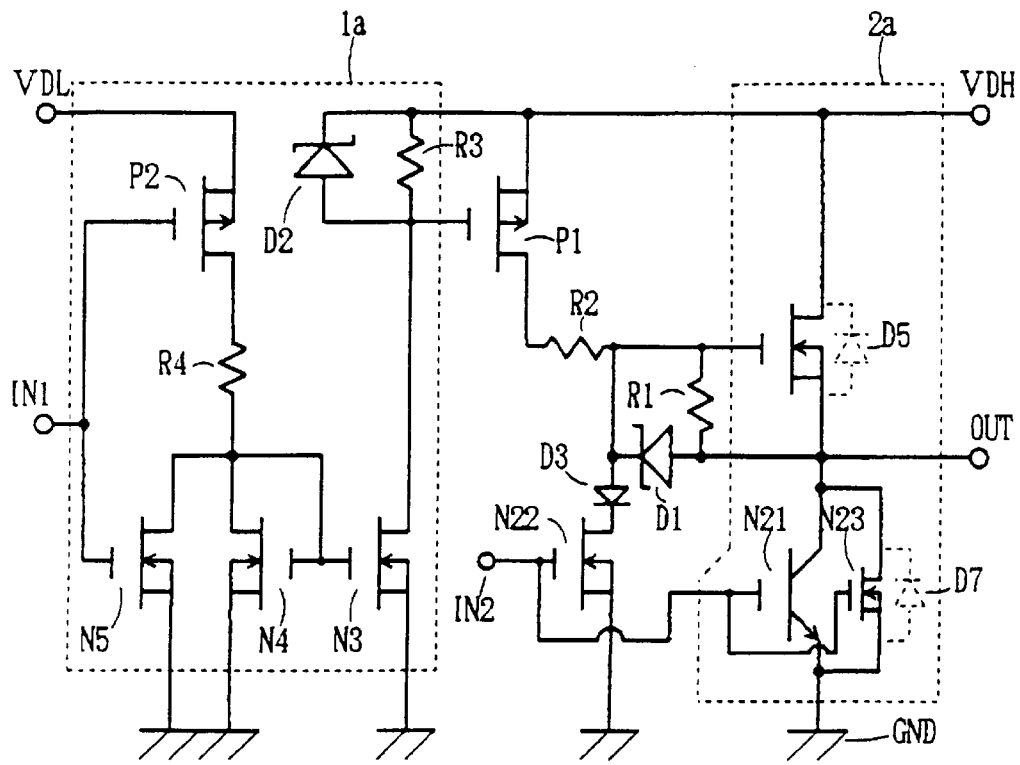
FIG. 23 is a circuit diagram of a twenty third embodiment of an output circuit for a power IC with a high breakdown voltage according to the invention which connects a second auxiliary n-channel N23 in substitute for the freewheeling diode D4 on the lower arm of the totem-pole circuit of FIG. 17.

FIG. 23 is a circuit diagram of a twenty third embodiment of an output circuit for a power IC with a high breakdown voltage according to the invention which connects a second auxiliary n-channel MOSFET N23 in substitute for the free-wheeling diode D4 on the lower arm of the totem-pole circuit 2a of FIG. 17.

Referring now to FIG. 23, the reverse current on the lower arm is made flow through the parasitic diode D7 of the second auxiliary n-channel MOSFET N23.

The MOSFET N23 and the IGBT N21 are connected with each other in the same manner as described with reference to FIG. 22. Since the MOSFET N23 and the IGBT N21 operate in synchronism with each other, the current carrying capability of the lower arm in the forward conduction is higher than that of the circuit configuration which arranges the free-wheeling diode D4 on the lower arm. It is not necessary to arrange another free-wheeling diode on the upper arm of the totem-pole circuit 2a, since a reverse current on the upper arm may flow through the parasitic diode D5 of the MOSFET N1.

Figure 24:
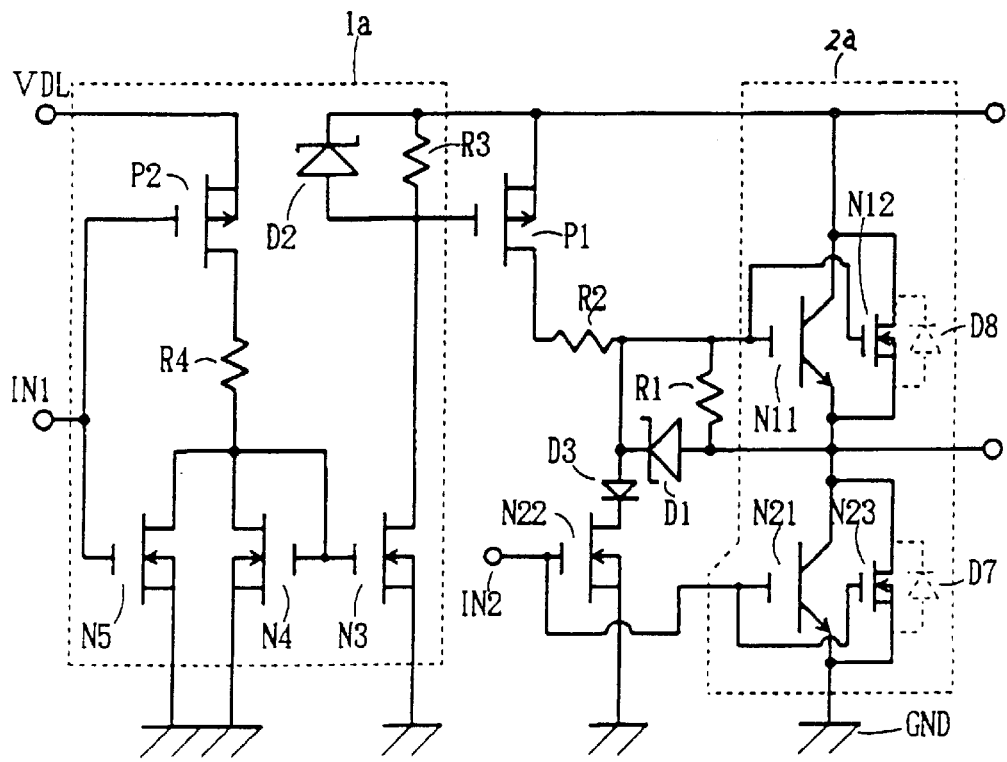
FIG. 24 is a circuit diagram of a twenty fourth embodiment of an output circuit for a power IC with a high breakdown voltage according to the invention which connects second auxiliary n-channel MOSFETs in substitute for the respective freewheeling diodes on the upper and lower arms of the totem-pole circuit of FIG. 19.

FIG. 24 is a circuit diagram of a twenty fourth embodiment of an output circuit for a power IC with a high breakdown voltage according to the invention which connects second auxiliary n-channel MOSFETs N12 and N23 in substitute for the respective free-wheeling diodes D6 and D4 on the upper and lower arms of the totem-pole circuit 2a of FIG. 19.

Referring now to FIG. 24, the reverse current on the upper arm is made flow through the parasitic diode D8 of the second auxiliary MOSFET N12 and the reverse current on the lower arm is made flow through the parasitic diode D7 of the second auxiliary MOSFET N23.

The MOSFET N12 and the IGBT N11 are connected with each other in the same manner as described with reference to FIG. 22. Since the MOSFET N12 and the IGBT N11 operate in synchronism with each other, the current carrying capability of the upper arm in the forward conduction is higher than that of the circuit configuration which arranges the free-wheeling diode D6 on the upper arm.

The MOSFET N23 and the IGBT N21 are connected with each other in the same manner as described with reference to FIG. 22. Since the MOSFET N23 and the IGBT N21 operate in synchronism with each other, the current carrying capability of the lower arm in the forward conduction is higher than that of the circuit configuration which arranges only the free-wheeling diode D4 on the lower arm.

Figure 25:
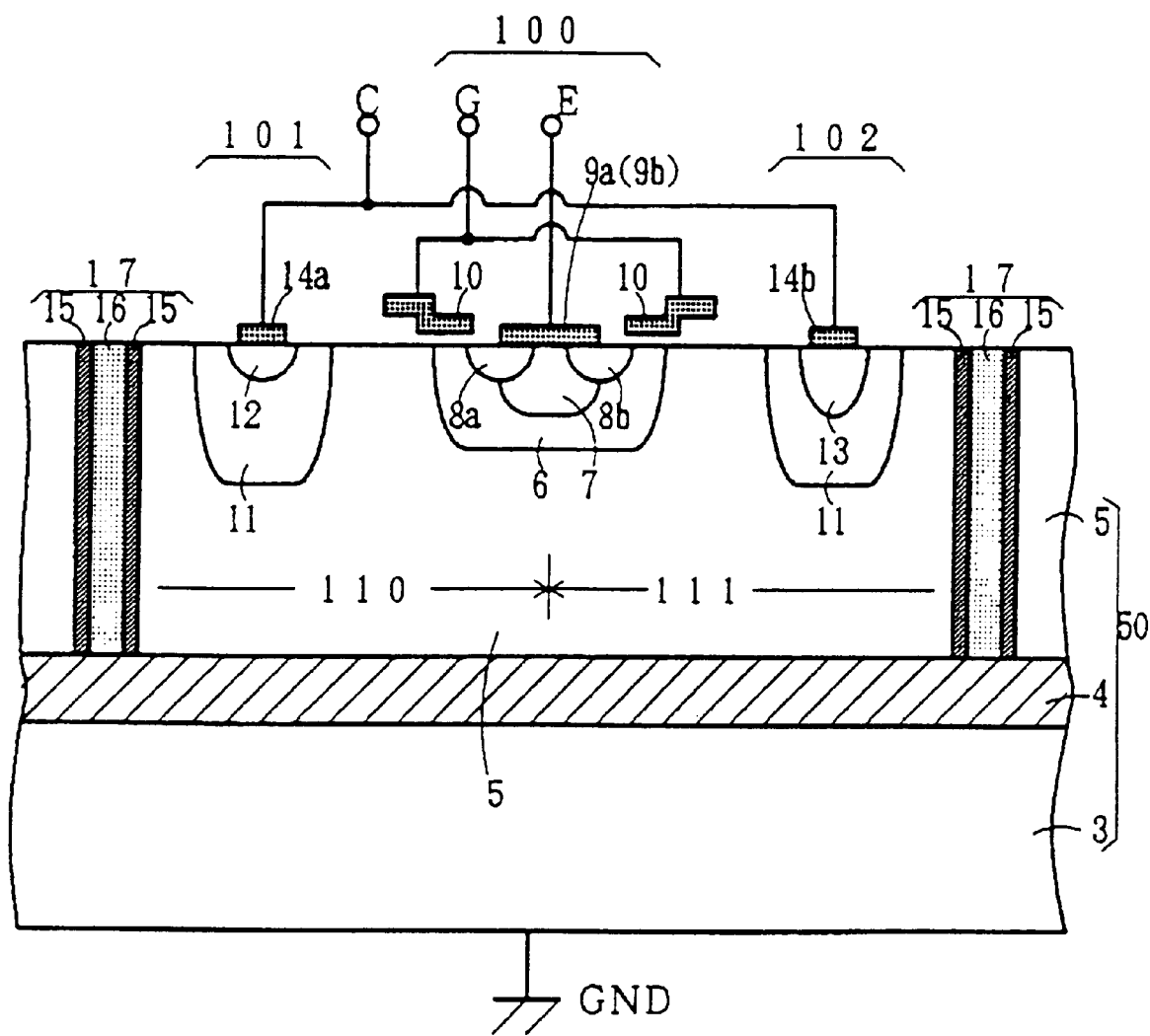
FIG. 25 is a cross section showing the IGBT on the upper arm of the totem-pole circuit of FIG. 20 and the second auxiliary MOSFET in a semiconductor region on a dielectric separation substrate in a SOI wafer.

FIG. 25 is a cross section showing the IGBT N1 on the upper arm of the totem-pole circuit of FIG. 20 and the second auxiliary MOSFET N12 in a semiconductor region on a dielectric separation substrate in a SOI wafer.

Referring now to FIG. 25, a semiconductor substrate 5 of a first conductivity type is on an oxide film 4 laminated on a semiconductor substrate 3 of the first conductivity type or a second conductivity type. The semiconductor substrate 5 is divided by the trenches extending from the surface of the semiconductor substrate 5 to the oxide film 4. Side wall oxide films 15 are on the side walls of the trenches. The trench is filled with polycrystalline semiconductor 16. Thus, a SOI wafer 50 is formed. A base region 6 of the second conductivity type is in the surface portion of the semiconductor substrate 5 in the SOI wafer 50. A source region 8a of the first conductivity type, an emitter region 8b of the first conductivity type, and a contact region 7 of the second conductivity type are in the surface portion of the base region 6. (The regions 8a and 8b are continuous to each other. And, the region, wherein a MOSFET is formed, is denoted as the "source region", and the region, wherein an IGBT is formed, is denoted as the "emitter region".) A gate electrode 10 is above the base region 6 with a not shown gate oxide film interposed in-between. Two buffer regions 11, 11 of the first conductivity type are in the surface portion of the semiconductor substrate 5. The buffer regions 11, 11 are spaced apart from the base region 6. A heavily doped drain region 12 of the first conductivity type is in the surface portion of one of the buffer regions 11, 11. The drain region 12 is formed to be a drain side 101 of a MOSFET region 110. A heavily doped collector region 13 of the second conductivity type is in the surface portion of the other one of the buffer regions 11, 11. The collector region 13 is formed to be a collector side 102 of an IGBT region 111. Usually the first conductivity type is n-type and the second conductivity type is p-type, though there will be no problems if the first conductivity type is p-type and the second conductivity type is n-type.

Since an emitter electrode 9b of the IGBT N11 on the upper arm and a source electrode 9a of the second auxiliary n-channel MOSFET N12 may be formed to be a common electrode and since a collector electrode 14b of the IGBT N11 and a drain electrode 14a of the MOSFET N12 may be formed to be a common electrode, the IGBT N11 and the MOSFET N12 can be formed in one semiconductor region.

In the structure described above, the emitter region 8a of the IGBT portion and the source region 8b of the MOSFET portion adjacent to the IGBT portion are formed to be a common region. The collector electrode 14b of the IGBT portion and the drain electrode 14a of the MOSFET portion are connected with each other by wiring. Thus, the area necessary for forming the IGBT N11 and MOSFET N12 is reduced as compared with the area necessary for forming the IGBT N11 and MOSFET N12 in the individual regions.

The device configuration as described above is applicable also to the free-wheeling diode arranged for making a reverse current flow. In this occasion, the emitter region of the IGBT portion and the anode region of the diode portion are formed to be a common region. In addition, the collector electrode of the IGBT portion and the anode of the diode portion are connected with each other by wiring.

Figure 26A:
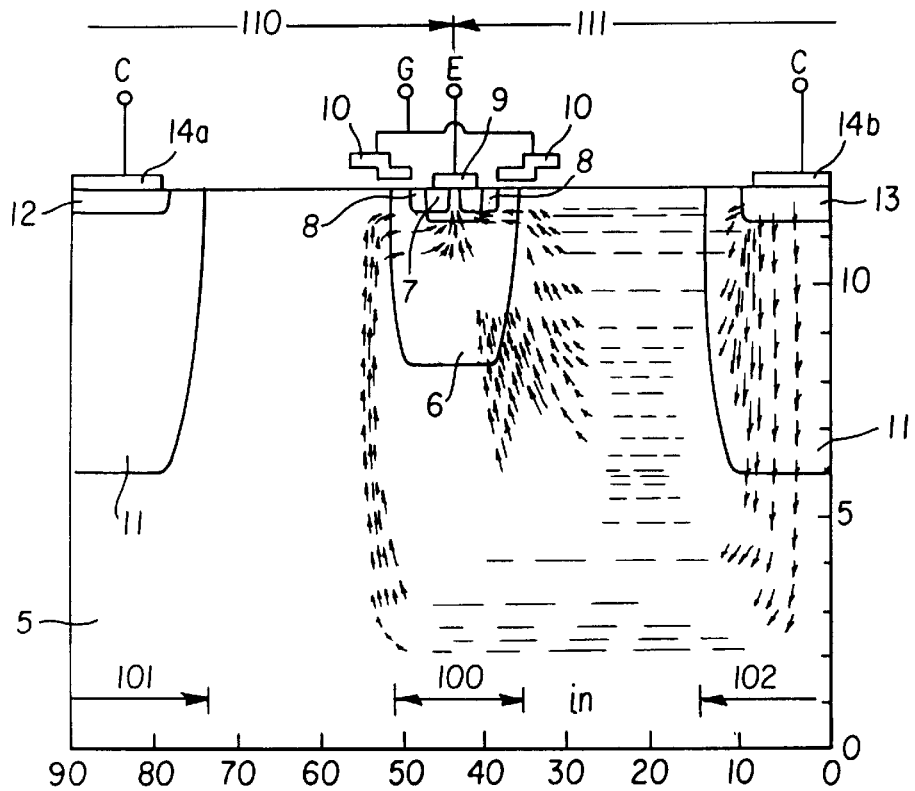
FIG. 26(a) is a distribution chart of the hole current obtained by simulation for the device region shown in FIG. 25.
Figure 26B:
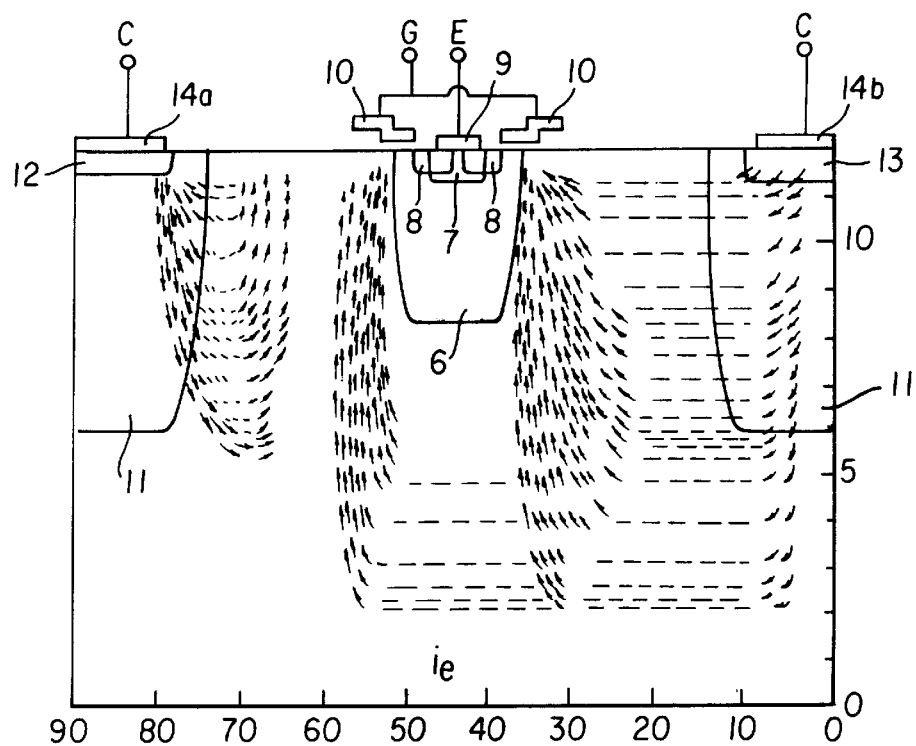
FIG. 26(b) is a distribution chart of the electron current obtained by simulation for the device region shown in FIG. 25.

FIG. 26(a) is a distribution chart of the hole current obtained by simulation for the device region shown in FIG. 25. FIG. 26(b) is a distribution chart of the electron current obtained by simulation for the device region shown in FIG. 25.

Referring now to FIGS. 26(a) and 26(b), the IGBT region 111 occupies the right hand side of the figures and the MOSFET region 110 occupies the left hand side of the figures. The reference numerals and symbols in FIGS. 26(a) and 26(b) designate the respective corresponding constituents in FIG. 25. The hole current ih flows only through the IGBT portion. The electron current ie flows through the IGBT portion and MOSFET portion. That is, the second auxiliary n-channel MOSFET N12 for making a reverse current flow makes a current flow also when a forward bias voltage is applied. Therefore, the current carrying capability under the forward bias voltage application of the circuit which includes a parallel connection of an n-channel MOSFET for making a reverse current flow is higher than that of the circuit which includes a parallel connection of a free-wheeling diode for making a reverse current flow.

Figure 27:
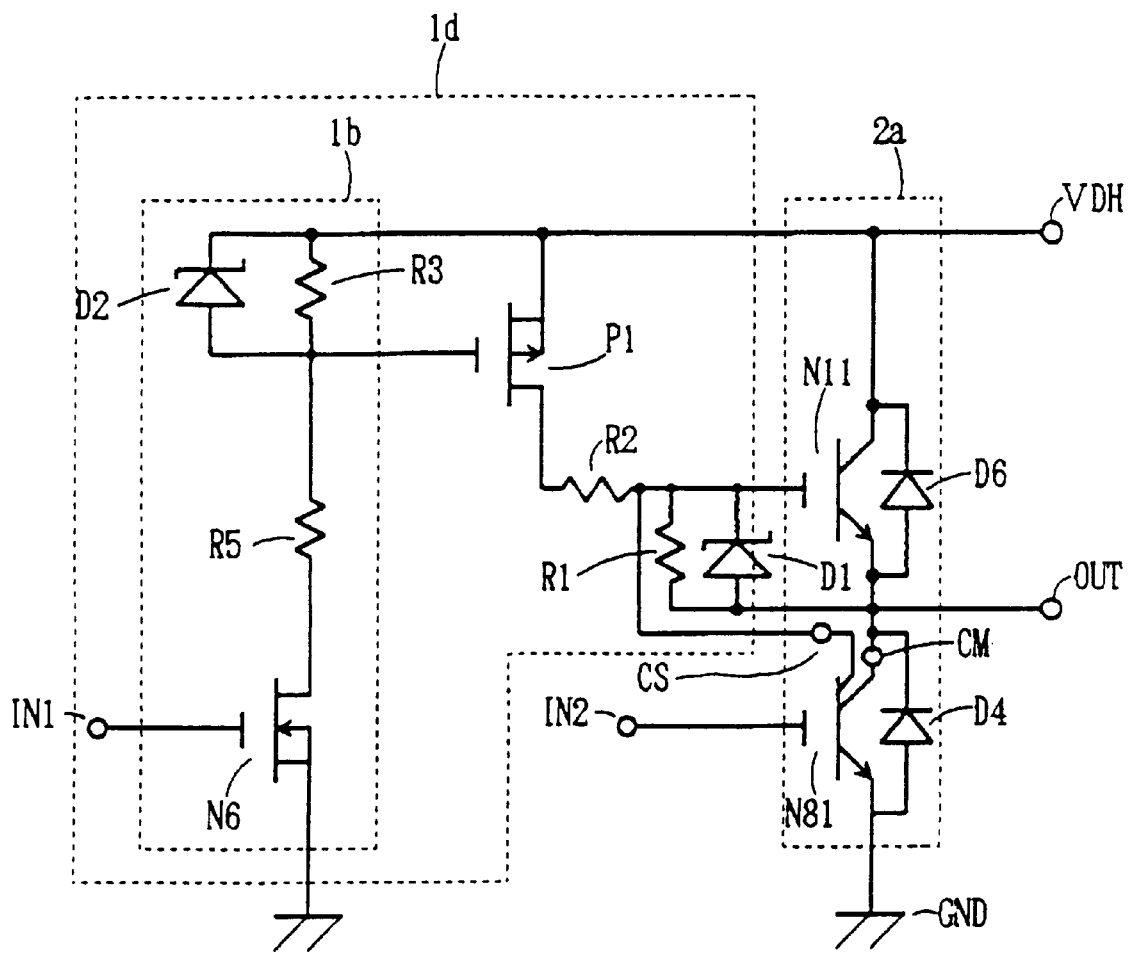
FIG. 27 is a circuit diagram of a twenty fifth embodiment of an output circuit for a power IC with a high breakdown voltage according to the invention which adopts a multi-collector structure for the IGBT on the lower arm of the totem-pole circuit.

FIG. 27 is a circuit diagram of a twenty fifth embodiment of an output circuit for a power IC with a high breakdown voltage according to the invention which adopts a multi-collector structure for the IGBT N81 on the lower arm of the totem-pole circuit 2a.

The totem-pole circuit 2a of FIG. 27 includes, on the upper arm thereof, an IGBT N11 and a free-wheeling diode D6 which substitute the n-channel MOSFET N1 of FIG. 2. The totem-pole circuit 2a of FIG. 27 includes, on the lower arm thereof, an IGBT N81 having a multi-collector structure and a free-wheeling diode D4 which substitute the n-channel MOSFET N2 of FIG. 2. The multi-collector structure includes a CM portion, which is a main collector for making a main current flow, and a CS portion, which is an auxiliary collector for dividing the main current. Hereinafter, the main collector terminal will be referred to as a "CM terminal" and the auxiliary terminal as a "CS terminal". The CM terminal, connected to an output terminal, is a terminal for making the main current flow. The CS terminal is connected to the gate of the IGBT N11 and used for preventing arm-short-circuit from causing. The IGBT N81 is of n-channel type.

The circuit of FIG. 27 works as follows. When the IGBT N81 is turned on, currents flow into the IGBT N81 via the terminals CM and CS. The current from the CM terminal flows through a Zener diode D1. Therefore, the emitter potential of the IGBT N11 is higher by the voltage drop across the Zener diode D1 than gate potential of the IGBT N11. Since the gate voltage of the IGBT N11 is suppressed to be lower than the emitter potential of the IGBT N11 due to the above described potential scheme, IGBT N11 will never be turned on as far as the IGBT N81 if; in its on-state. Thus, the arm-short-circuit is prevented from causing.

Since the IGBT N81 with low on-resistance is also used for preventing the arm-short-circuit from causing, the gate potential rise of the IGBT N81 by the voltage drop across the IGBT N11 is suppressed to be low enough even when a short-circuit current is caused via a p-channel MOSFET P1. Therefore, the short-circuit current via the p-channel MOSFET P1 will never cause the arm-short-circuit between the IGBTs N81 and N11.

The circuit, including a level-shift circuit, for driving the device on the upper arm of the totem-pole circuit 2a works as follows. When a signal for driving the IGBT N11 on the upper arm of the totem-pole circuit 2a is inputted to an n-channel MOSFET N6 and the current flowing through the MOSFET N6 flows through the resistor R3, the p-channel MOSFET P1 is turned on. In addition, the gate voltage for driving the IGBT N11 is generated by the current flowing through the MOSFET P1 and the resistor R1.

The Zener diode D1 is indispensable for suppressing the potential rise between the emitter and gate of the IGBT N11. A resistor R2 is the one for controlling the speed of charging up the gate of the IGBT N11. Since the resistance of the resistor R2 is adjusted according to the characteristics of the circuit, the resistor R2 may be short-circuited with no problems. A resistor R5 is connected to the drain terminal of the n-channel MOSFET N6 with a high breakdown voltage in the circuit for driving the device on the upper arm and in series to a resistor R3 for suppressing the current consumption in the circuit for driving the device on the upper arm as well as for dividing the voltage. Usually, the resistance of the resistor R5 is several M ohms.

Figure 28:
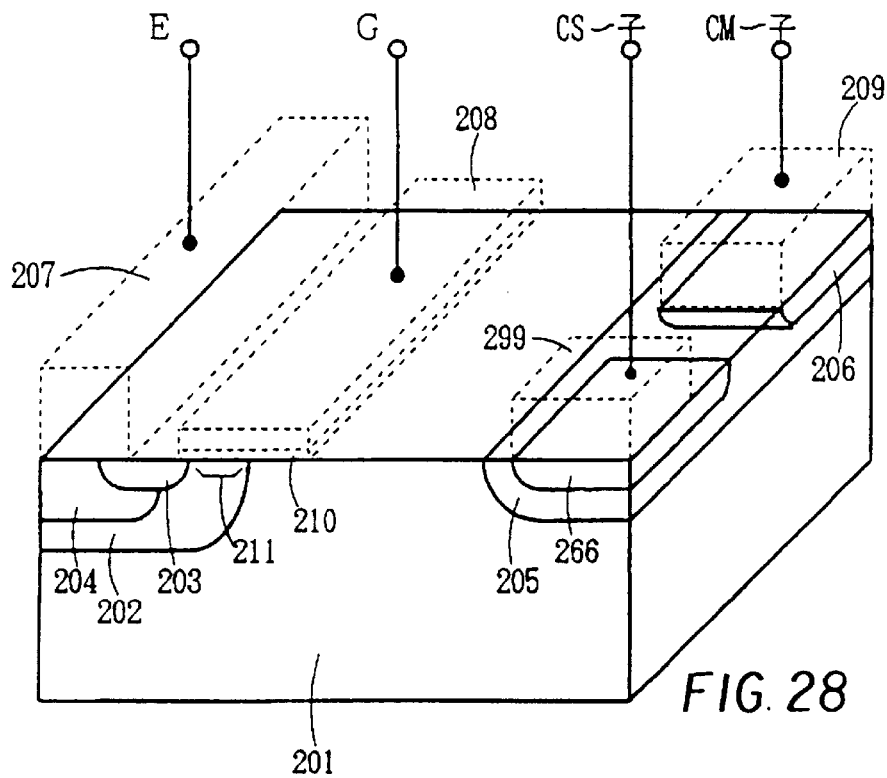
FIG. 28 shows a twenty sixth embodiment of an output circuit according to the invention, which is a cross sectional structure of a lateral IGBT having the multi-collector structure of FIG. 27.

FIG. 28 shows a twenty sixth embodiment of an output circuit according to the invention, which is a cross-sectional structure of a lateral IGBT having the multi-collector structure of FIG. 27.

As shown in FIG. 28, it is necessary to adopt the lateral structure for constructing on one chip a power IC which integrates many output circuits which employ respective totem-pole circuits. Referring now to FIG. 28, a substrate 201 of a first conductivity type employs a SOI wafer or a junction-separation substrate. A base region 202 of a second conductivity type is in the surface portion of the substrate 201. A source region 203 of the first conductivity type and a contact region 204 of the second conductivity type are in the surface portion of the base region 202. An emitter electrode 207 contacts with the contact region 204 and a part of the source region 203. A gate electrode 208 is on a gate insulation film 210. The portion of the base region 202 extending underneath the gate insulation film 210 between the source region 203 and the substrate 201 is a channel region 211.

A buffer region 205 of the second conductivity type is spaced apart from the base region 202 for a certain spacing. A main collector region 206 of the second conductivity type and an auxiliary collector region 266 are in the buffer region 205. The main collector region 206 is a device region constituting a main circuit. A CM terminal connected to the output terminal OUT of FIG. 27 contacts with the main collector region 206. The auxiliary collector region 266 is a device region constituting a circuit for arm-short-circuit prevention. A CS terminal, which is an auxiliary collector terminal for making a part of the main current flow, contacts with the auxiliary collector region 266. The regions 206 and 266 are formed by diffusion in the same buffer region 205 and spaced apart from each other for a certain spacing to avoid mutual interference.

An emitter terminal E and a gate terminal G are common to the devices including the main collector region 206 and the auxiliary collector region 266, respectively.

Figure 29:
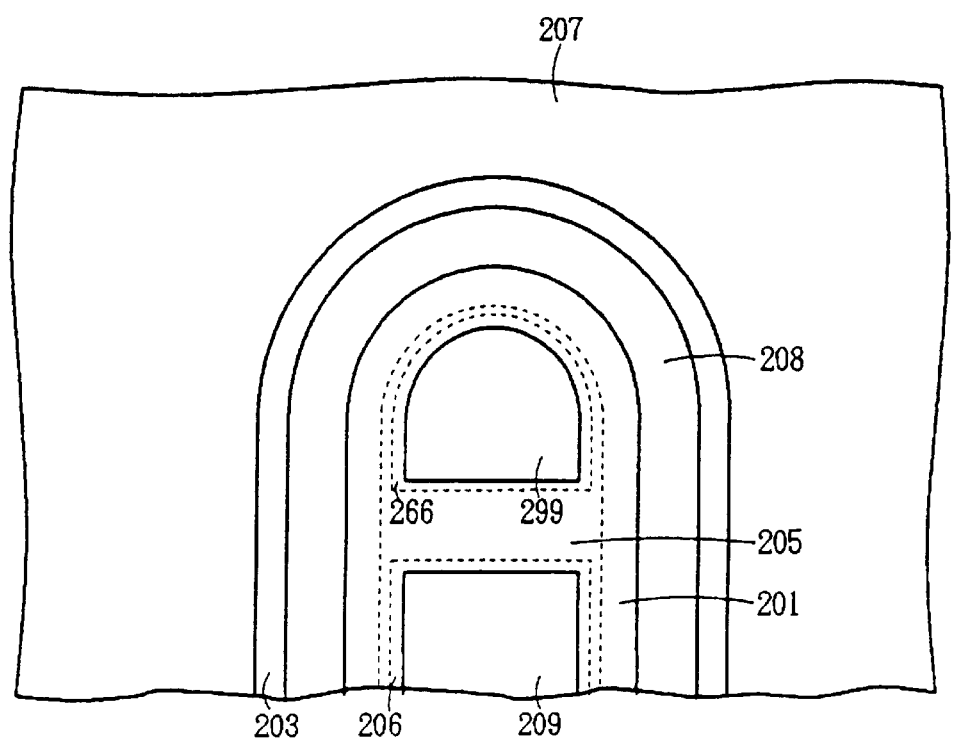
FIG. 29 is a top plan view of an electrode pattern on the devices of FIG. 28.

FIG. 29 is a top plan view of an electrode pattern on the devices of FIG. 28. Various planar patterns are possible. In FIG. 28, the device region for arm-short-circuit prevention is in the edge portion of all the device regions. In FIG. 29, the reference numeral 207 designates an emitter electrode, 208 a gate electrode, 209 a main collector electrode and 299 an auxiliary collector electrode. The auxiliary collector electrode 299 is used for preventing arm-short-circuit from causing.

Figure 30:
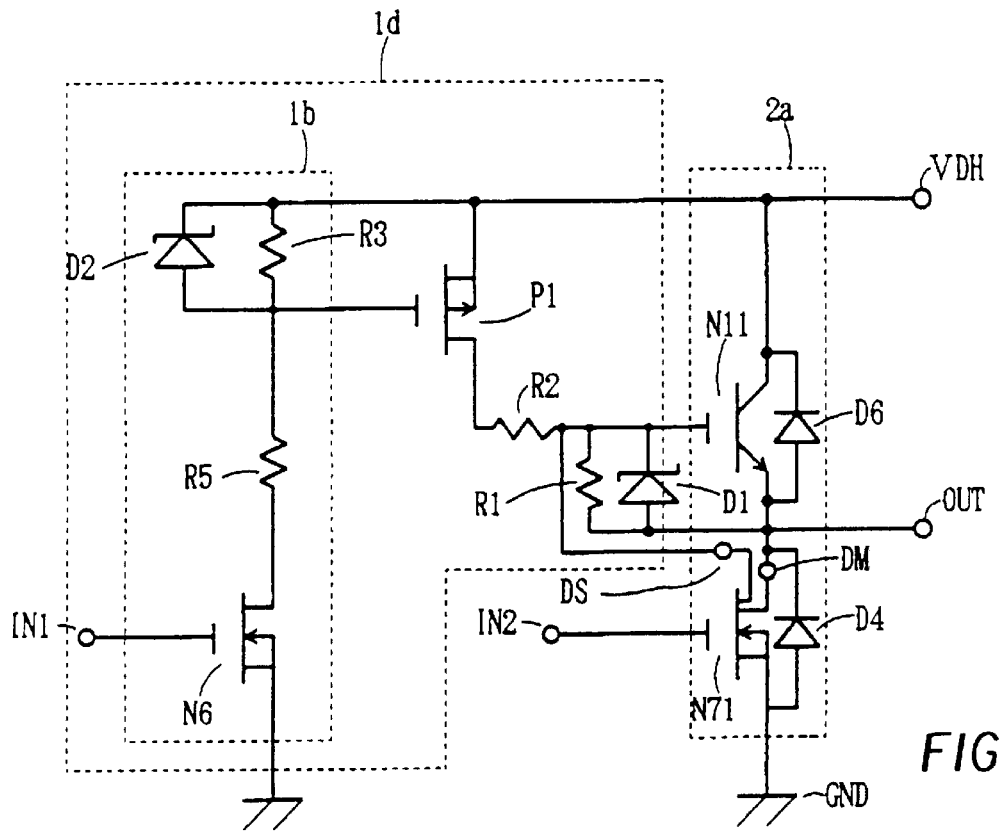
FIG. 30 is a circuit diagram of a twenty seventh embodiment of an output circuit for a power IC with a high breakdown voltage according to the invention which employs an n-channel MOSFET having a high breakdown voltage and a multi-drain structure for the device on the lower arm of the totem-pole circuit.

FIG. 30 is a circuit diagram of a twenty seventh embodiment of an output circuit for a power IC with a high breakdown voltage according to the invention which employs an n-channel MOSFET N71 having a high breakdown voltage and a multi-drain structure for the device on the lower arm of the totem-pole circuit 2a.

The output circuit of FIG. 30 substitutes the n-channel MOSFET N71 having a high breakdown voltage and a multi-drain structure for the IGBT N81 with a multi-collector structure and the free-wheeling diode D4 of FIG. 27.

Referring now to FIG. 30, a driver circuit 1d for driving the device on the upper arm of a totem-pole circuit 2a includes a p-channel MOSFET P1 with a high breakdown voltage. The driver circuit 1d occupies the region surrounded by the dotted lines and including the shift register circuit 1a and the p-channel MOSFET P1.

A DM terminal and a DS terminal constitute the drain terminal of the n-channel MOSFET N71 with a multi-drain structure. The DM terminal is a terminal, connected to the output terminal OUT, for making a am current flow. The DS terminal is connected to the gate terminal of the IGBT N11 so that the IGBT N11 may work as a device for preventing arm-short-circuit from causing. The diffusion layer for the DS terminal and the diffusion layer with which the DS terminal contacts are in a lightly doped diffusion layer and spaced apart for a sufficiently long distance.

The output circuit of FIG. 30 works in the same manner as the output circuit of FIG. 27.

Figure 31:
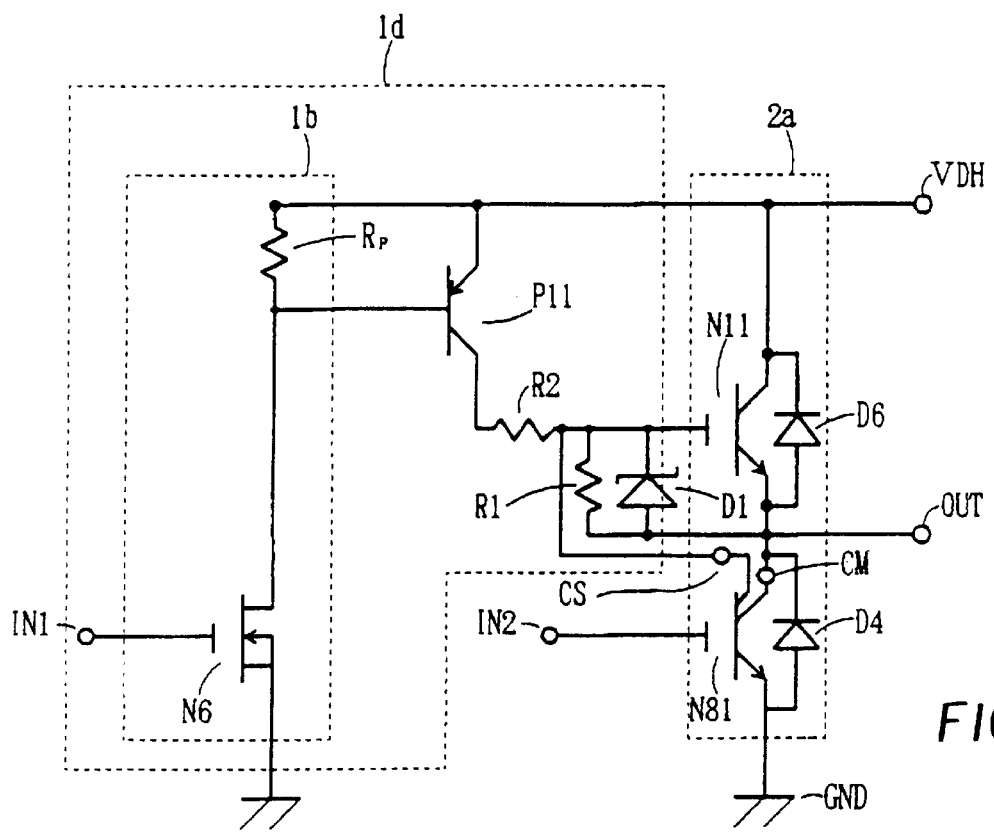
FIG. 31 is a circuit diagram of a twenty eighth embodiment of an output circuit for a power IC with a high breakdown voltage according to the invention which employs a pnp-transistor with a high breakdown voltage in substitute for the p-channel MOSFET in the driver circuit for driving the device on the upper arm of the totem-pole circuit of FIG. 27.

FIG. 31 is a circuit diagram of a twenty eighth embodiment of an output circuit for a power IC with a high breakdown voltage according to the invention which employs a pnp-transistor P11 with a high breakdown voltage in substitute for the p-channel MOSFET P1 in the driver circuit for driving the device on the upper arm of the totem-pole circuit 2a of FIG. 27.

Referring now to FIG. 31, the resistor R3 of FIG. 27 works as a pull-up resistor Rp of the pnp-transistor P11. The pull-up resistor Rp is a resistor, the voltage across which drives the pnp-transistor. In the driver circuit 1d of FIG. 31, the resistor R5 for resistive potential division is not necessary. The output circuit of FIG. 31 works in the same manner as the output circuit of FIG. 27. As explained earlier, the circuit configuration of FIG. 31 prevents the arm-short circuit of the main circuit caused by the driver circuit 1d for driving the device on the upper arm of the totem-pole circuit from causing.

Figure 32:
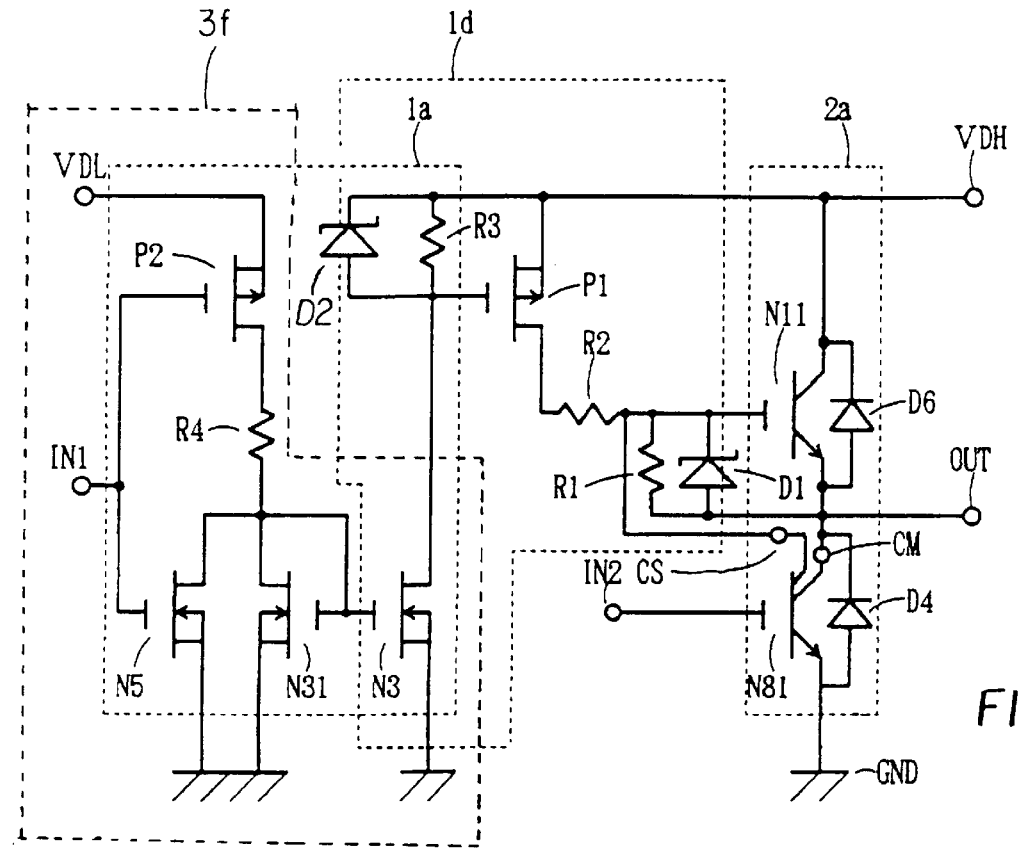
FIG. 32 is a circuit diagram of a twenty ninth embodiment of an output circuit for a power IC with a high breakdown voltage according to the invention which connects a constant-current circuit, including a mirror circuit, in front of the driver circuit for driving the device on the upper arm of the totem-pole circuit.

FIG. 32 is a circuit diagram of a twenty ninth embodiment of an output circuit for a power IC with a high breakdown voltage according to the invention which connects a constant-current circuit 3f, including a mirror circuit using an n-channel MOSFET N31 having a structure for exhibiting a certain breakdown voltage same with that of the n-channel MOSFET N3, in front of the driver circuit 1d for driving the device on the upper arm of the totem-pole circuit. This circuit configuration facilitates controlling the current which flows through the n-channel MOSFET N3 in the driver circuit 1d by the resistor R4 of several tens of thousands of ohms.

The circuit configuration facilitates improvement of the delay time of the constant current circuit by the adjustment of the resistance R4 by means of narrowing the channel width of the MOSFET N3 in the mirror circuit more than that of the MOSFET N31 without increasing the current consumption in the driver circuit 1d for driving the device on the upper arm.

Figure 33:
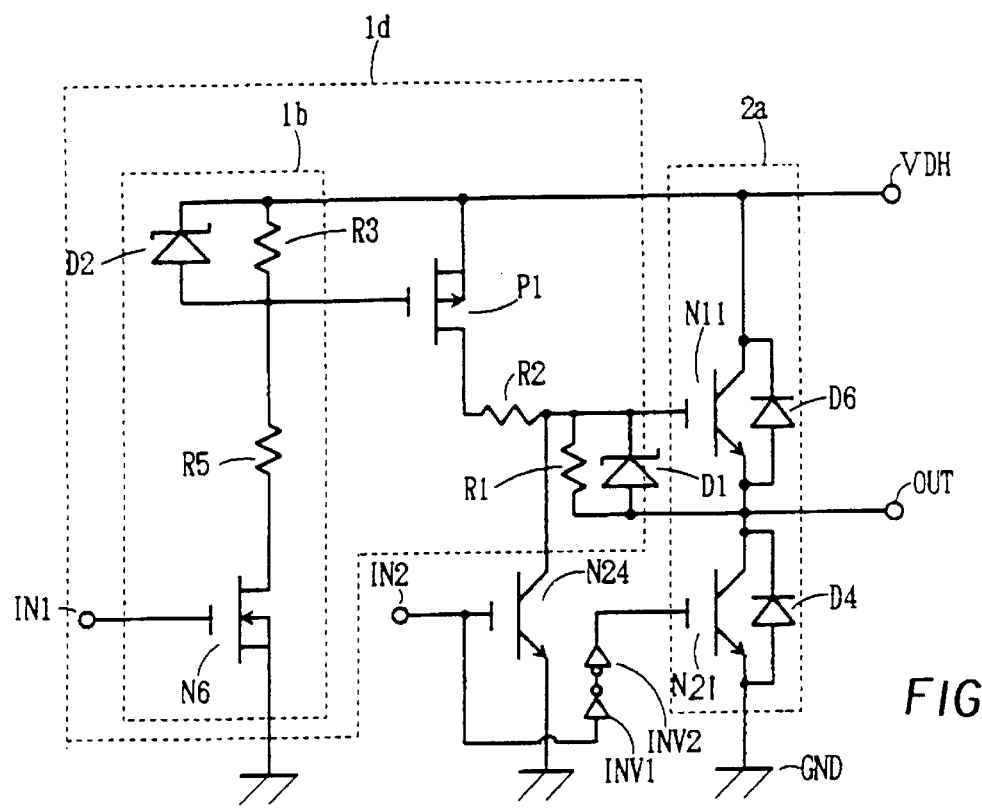
FIG. 33. is a circuit diagram of a thirtieth embodiment of an output circuit for a power IC with a high breakdown voltage according to the invention which includes a circuit for arm-short-circuit prevention.
Figure 34:
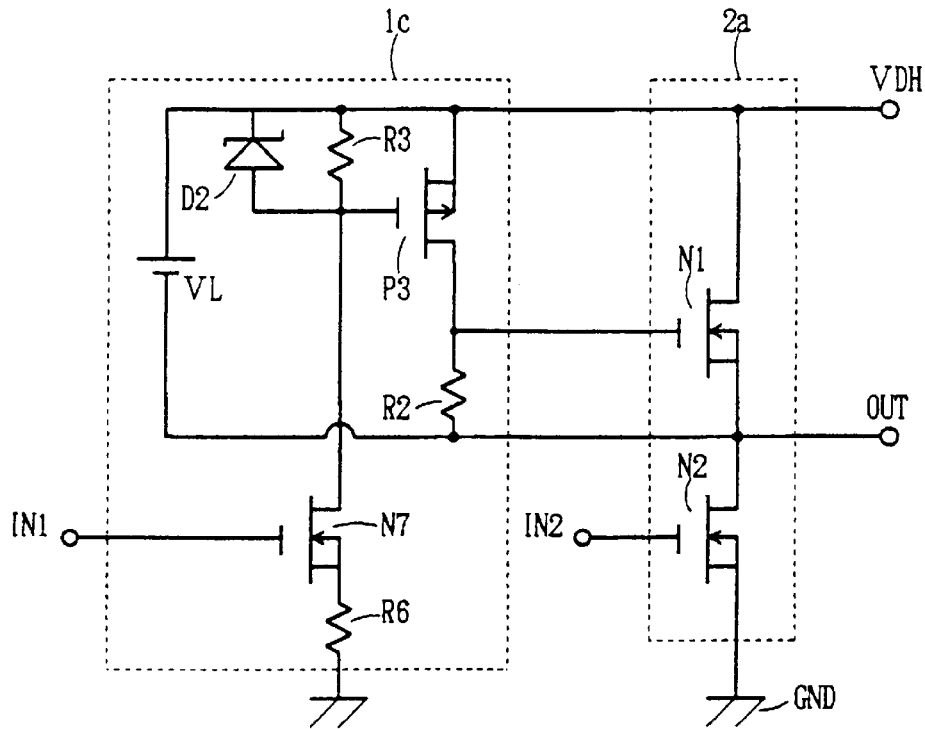
FIG. 34 is a circuit diagram of a conventional output circuit for a power IC with a high breakdown voltage including a totem-pole circuit.
Figure 35:
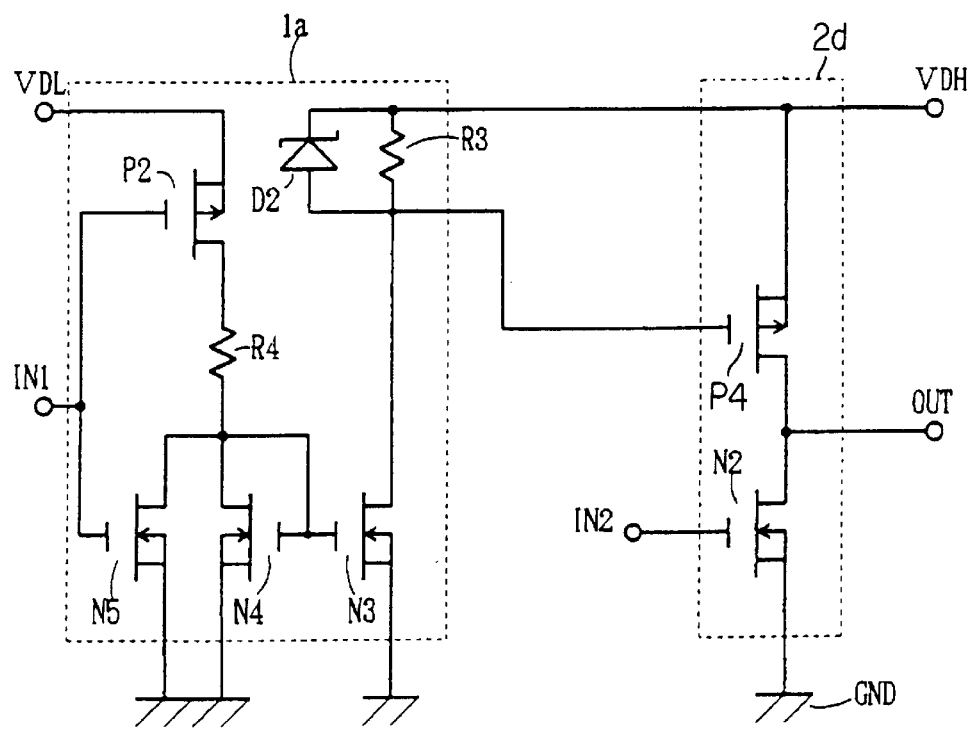
FIG. 35 is a circuit diagram of another conventional output circuit of a power IC with a high breakdown voltage including a push-pull circuit.

FIG. 33 is a circuit diagram of a thirtieth embodiment of an output circuit for a power IC with a high breakdown voltage according to the invention which includes a circuit for arm-short-circuit prevention. The output circuit of FIG. 33 employs an IGBT N24 for the device for preventing arm-short-circuit from causing. The collector terminal of the IGBT N24 is connected to the gate terminal of an n-channel IGBT N11 on the upper arm of a totem-pole circuit 2a. The emitter terminal of the IGBT N24 is connected to the ground. In addition, the gate terminal of the IGBT N24 is connected to the gate terminal of the IGBT N21 on the lower arm of the totem-pole circuit 2a. By connecting the IGBT N24 in parallel to the IGBT N21 on the lower arm of the totem-pole circuit 2a, the circuit for arm-short-circuit prevention is constructed. Since a current is made flow to the IGBT N24 via a diode D1 arranged between the emitter and gate of the IGBT N11 on the upper arm simultaneously with the turn-on of the IGBT N24, the emitter potential of the IGBT N1 is maintained to be higher than the gate potential of the IGBT N11. Due to this, the IGBT N11 will not be turned on usually as far as the IGBT N2 on the lower arm is in its on-state. It is effective to prevent unwanted turn-on of the IGBT N11, caused by noise and such disturbances, without fail by connecting two inverters INV1 and INV2 in series to the gate of the IGBT N21 so that the start of turning-on of the IGBT N21 may be delayed by several n sec. from the start of turning-on of the IGBT N24. The start timing of the turn-on of the IGBT N21 is adjusted by the driving ability of the inverter INV2. The adjustment with the inverters INV1 and INV2 delays the start of turning-on of the IGBT N21 more securely than the adjustment of the device size. The above described circuit configuration for arm-short-circuit prevention is effectively applicable to the eighth, ninth, tenth, eleventh, seventeenth, eighteenth, nineteenth, twenty third and twenty fourth embodiments.

As explained above, the p-channel device with a high breakdown voltage such as the p-channel MOSFET with a high breakdown voltage employed in the level-shift circuit for the totem-pole circuit facilitates omitting the independent power supply indispensable for the conventional circuit from the level-shift circuit. Thus, many totem-pole circuits with multiple outputs can be integrated on one chip.

By making a current flow through the device on the lower arm (low potential side) of the totem-pole circuit via a diode arranged between the source and gate or between the emitter and gate of the device on the upper arm (high potential side), the source potential or the emitter potential of the device on the upper arm is boosted to be higher than the gate potential. The boosted source potential or emitter potential prevents the device on the upper arm from turning-on when the device on the lower arm is in its on state. Thus, the arm-short-circuit is prevented from casing. The device on the lower arm i s used directly for the circuit for preventing the arm-short-circuit from causing. Alternatively, a separate auxiliary device is used for the circuit for preventing the arm-short-circuit from causing in addition to the device on the lower arm. By directly using the device on the lower arm, the number of constituent parts and devices of the circuit is prevented from increasing. By making the auxiliary device work in synchronism with the device on the lower arm, the arm-short-circuit is prevented from causing. By turning on the auxiliary device a little bit earlier than the device on the lower arm, the arm-short-circuit prevention is further guaranteed.

When the totem-pole circuit includes a bipolar device of voltage-driven type such as an IGBT, a reverse current is made flow by arranging a free-wheeling diode connected in opposite parallel to the IGBT. The cathode and the anode of the free-wheeling diode are connected to the collector and the emitter of the IGBT, respectively.

When an n-channel MOSFET is connected in parallel to the IGBT in substitute for the free-wheeling diode, the reverse current flows through the parasitic diode of the MOSFET and the forward current flows through the IGBT and the MOSFET. Thus, this circuit configuration improves the current carrying capability.

According to the invention, a multi-collector structure or a multi-drain structure is adopted to the device on the lower arm of the totem-pole circuit and an end of the multi-collector structure or the multi-drain structure is connected to the gate terminal of the device on the upper arm. This circuit configuration facilitates using the device on the lower arm for preventing the arm-short-circuit from causing and omitting the device arranged in parallel to the device on the lower arm for preventing the arm-short-circuit from causing. Thus, this circuit configuration facilitates preventing the arm-short-circuit from causing and reducing the occupied area of the output.

The driver circuit for driving the device on the upper arm of the totem-pole circuit is simplified by employing a p-channel device with a high breakdown voltage for the driver circuit.

The current consumption of the level shift circuit is reduced by connecting the resistance for current limitation to the d rain side of the n-channel MOSFET with a high breakdown voltage constituting the level shift circuit. The current consumption of the level shift circuit is also reduced by incorporating a constant-current circuit including a mirror circuit which employs a device having the same structure with that of the p-channel MOSFET.

The delay time of the constant current portion is improved without increasing the current consumption in the driver circuit by narrowing the channel width of the n-channel MOSFET constituting the mirror circuit and connected to the output side of the mirror circuit.

The arm-short-circuit is effectively prevented from causing by substituting a pnp-transistor with a high breakdown voltage for the p-channel MOSFET of the driver circuit for driving the device on the upper arm of the totem-pole circuit.

The invention has been described with reference to certain preferred embodiments thereof. It will be understood, however, that modifications and variations are possible within the scope of the appended claims.

What is claimed is:

1. An output circuit for a power IC with a high breakdown voltage, said output circuit comprising:
    a totem-pole circuit, said totem-pole circuit comprising an n-channel MOSFET with a high breakdown voltage on a high potential side of said totem-pole circuit, and an n-channel MOSFET with a high breakdown voltage on a low potential side of said totem-pole circuit;
    a level-shift circuit, said level-shift circuit driving said n-channel MOSFET on the high potential side;
    a p-channel MOSFET with a high breakdown voltage between the gate of said n-channel MOSFET on the high potential side and the output port of said level-shift circuit, the gate of said p-channel MOSFET being connected to said output port of said level-shift circuit;
    a first resistor between said gate of said n-channel MOSFET on the high potential side and the drain of said p-channel MOSFET; and
    a power supply, the high potential side thereof being connected to the source of said p-channel MOSFET.

2. An output circuit for a power IC with a high breakdown voltage, said output circuit comprising:
    a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, and an output terminal, said output terminal comprising a connection point connecting the source of said n-channel MOSFET on the high potential side and the drain of said n-channel MOSFET on the low potential side;
    a level-shift circuit, said level-shift circuit driving said n-channel MOSFET on the high potential side;
    a p-channel MOSFET with a high breakdown voltage, the gate thereof being connected to the output port of said level-shift circuit;
    a first resistor between the gate of said n-channel MOSFET on the high potential side and the drain of said p-channel MOSFET;
    a power supply, the high potential side thereof being connected to the source of said p-channel MOSFET,
    a second resistor; and
    a diode;
    wherein the first end of said second resistor and the cathode of said diode are connected to said gate of said n-channel MOSFET on the high potential side, and
    wherein second end of said second resistor and the anode of said diode being connected to said source of said n-channel MOSFET on the high potential side.

3. An output circuit for a power IC with a high breakdown voltage, said output circuit comprising:
    a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, a diode and an output terminal, said output terminal port comprising a connection point connecting the source of said n-channel MOSFET on the high potential side and the anode of said diode, the cathode of said diode being connected to the drain of said n-channel MOSFET on the low potential side;
    a level-shift circuit, said level-shift circuit driving said n-channel MOSFET on the high potential side;
    a p-channel MOSFET with a high breakdown voltage, the gate thereof being connected to the output port of said level-shift circuit;
    a first resistor between the gate of said n-channel MOSFET on the high potential side and the drain of said p-channel MOSFET;
    a power supply, the high potential side thereof being connected to the source of said p-channel MOSFET;
    a third resistor between said gate and said source of said n-channel MOSFET on the high potential side; and said gate of said n-channel MOSFET on the high potential side being connected to said cathode of said diode.

4. An output circuit for a power IC with a high breakdown voltage, said output circuit comprising:

a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, a diode, a first auxiliary diode, a second auxiliary diode and an output terminal, said output terminal comprising a connection point connecting the source of said n-channel MOSFET on the high potential side and the anode of said diode, the cathode of said diode being connected to the anode of said first auxiliary diode, the cathode of said first auxiliary diode being connected to the drain of said n-channel MOSFET on the low potential side, said source of said n-channel MOSFET on the high potential side being connected to the cathode of said second auxiliary diode;

a level-shift circuit, said level-shift circuit driving said n-channel MOSFET on the high potential side;

a p-channel MOSFET with a high breakdown voltage, the gate thereof being connected to the output port of said level-shift circuit;

a first resistor between the gate of said n-channel MOSFET on the high potential side and the drain of said p-channel MOSFET;

a power supply, the high potential side thereof being connected to the source of said p-channel MOSFET;

a third resistor between said gate and said source of said n-channel MOSFET on the high potential side; and said gate of said n-channel MOSFET on the high potential side being connected to said cathode of said diode.

5. An output circuit for a power IC with a high breakdown voltage, said output circuit comprising:

a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, and an output terminal, said output terminal comprising a connection point connecting the source of said n-channel MOSFET on the high potential side and the drain of said n-channel MOSFET on the low potential side;

a level-shift circuit, said level-shift circuit driving said n-channel MOSFET on the high potential side;

a p-channel MOSFET with a high breakdown voltage, the gate thereof being connected to the output port of said level-shift circuit;

a first resistor between the gate of said n-channel MOSFET on the high potential side and the drain of said p-channel MOSFET;

a power supply, the high potential side thereof being connected to the source of said p-channel MOSFET;

a third resistor between said gate and said source of said n-channel MOSFET on the high potential side;

a diode, the anode thereof being connected to said source of said n-channel MOSFET on the high potential side; and a first auxiliary n-channel MOSFET with a high breakdown voltage, the drain thereof being connected to said gate of said n-channel MOSFET on the high potential side;

wherein the gate of said auxiliary n-channel MOSFET being connected to the gate of said n-channel MOSFET on the low potential side; and wherein the source of said auxiliary n-channel MOSFET being connected to the source of said n-channel MOSFET on the low potential side.

6. An output circuit for a power IC with a high breakdown voltage, said output circuit comprising:

a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, and an output terminal, said output terminal comprising a connection point connecting the source of said n-channel MOSFET on the high potential side and the drain of said n-channel MOSFET on the low potential side;

a level-shift circuit, said level-shift circuit driving said n-channel MOSFET on the high potential side;

a p-channel MOSFET with a high breakdown voltage, the gate thereof being connected to the output port of said level-shift circuit;

a first resistor between the gate of said n-channel MOSFET on the high potential side and the drain of said p-channel MOSFET;

a power supply, the high potential side thereof being connected to the source of said p-channel MOSFET;

a third resistor between said gate and said source of said n-channel MOSFET on the high potential side; and a diode, an anode thereof being connected to said source of said n-channel MOSFET on the high potential side and a cathode of said diode being connected to said gate of said n-channel MOSFET on the high potential side;

a first auxiliary diode, an anode thereof being connected to said cathode of said diode; and a first auxiliary n-channel MOSFET with a high breakdown voltage, the drain thereof being connected to the cathode of said first auxiliary diode;

wherein the gate of said first auxiliary n-channel MOSFET being connected to the gate of said n-channel MOSFET on the low potential side; and wherein the source of said auxiliary n-channel MOSFET is connected to the source of said n-channel MOSFET on the low potential side.

7. An output circuit for a power IC with a high breakdown voltage, said output circuited comprising:

a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, and an output terminal, said output terminal comprising a connection point connecting the source of said n-channel MOSFET on the high potential side and the drain of said n-channel MOSFET on the low potential side;

a level-shift circuit, said level-shift circuit driving said n-channel MOSFET on the high potential side;

a p-channel MOSFET with a high breakdown voltage, the gate thereof being connected to the output port of said level-shift circuit;

a first resistor between the gate of said n-channel MOSFET on the high potential side and the drain of said p-channel MOSFET;

a power supply, the high potential side thereof being connected to the source of said p-channel MOSFET;

a second resistor; and a diode;

wherein the first end of said second resistor and the cathode of said diode are connected to said gate of said n-channel MOSFET on the high potential side;

wherein the second end of said second resistor and the anode of said diode being connected to said source of said n-channel MOSFET on the high potential side;

wherein said drain of said n-channel MOSFET on the low potential side comprising a first region and a second region, said first region making a main current flow, said second region making a part of said main current flow, said first region and said second region being spaced apart from each other;

wherein said first region is connected to said source of said n-channel MOSFET on the high potential side; and wherein said second region is connected to said gate of said n-channel MOSFET on the high potential side.

8. The output circuit according to claim 1, wherein at least one of said n-channel MOSFETS of said totem-pole circuit is connected in parallel with an IGBT.

9. The output circuit according to claim 2, wherein at least one of said n-channel MOSFETs of said totem-pole circuit is connected in parallel with an IGBT.

10. The output circuit according to claim 3, wherein at least one of said n-channel MOSFETs of said totem-pole circuit is connected in parallel with an IGBT.

11. The output circuit according to claim 4, wherein at least one of said n-channel MOSFETs of said totem-pole circuit is connected in parallel with an IGBT.

12. The output circuit according to claim 5, wherein at least one of said n-channel MOSFETs of said totem-pole circuit is connected in parallel with an IGBT.

13. The output circuit according to claim 6, wherein at least one of said n-channel MOSFETs of said totem-pole circuit is connected in parallel with an IGBT.

14. The output circuit according to claim 7, comprising a first n-channel IGBT and a first free-wheeling diode, said first n-channel IGBT and said first freewheeling diode replacing said n-channel MOSFET on the high potential side;

a second n-channel IGBT and a second free-wheeling diode, said second n-channel IGBT and said second free-wheeling diode replacing said n-channel MOSFET on the low potential side; and wherein the collector of said second n-channel IGBT comprising a first collector region and a second collector region, said first and second collector regions being spaced apart from each other.

15. The output circuit according to claim 7, wherein said level-shift circuit comprises a constant-current circuit comprising a mirror circuit, said mirror circuit comprising a first n-channel MOSFET with a high breakdown voltage and a second n-channel MOSFET, said first and second n-channel MOSFET's having a structure with the same breakdown voltage, and the channel width of said first n-channel MOSFET and the channel width of said second n-channel MOSFET being different from each other.

16. An output circuit for a power IC with a high breakdown voltage, said output circuit comprising:

a totem-pole circuit, said totem-pole circuit comprising an n-channel MOSFET with a high breakdown voltage on a high potential side of said totem-pole circuit, and an n-channel MOSFET with a high breakdown voltage on a low potential side of said totem-pole circuit;

a level-shift circuit, said level-shift circuit driving said n-channel MOSFET on the high potential side;

a pnp-transistor with a high breakdown voltage between the gate of said n-channel MOSFET on the high potential side and the output port of said level-shift circuit, the gate of said pnp-transistor being connected to said output port of said level-shift circuit;

a first resistor between said gate of said n-channel MOSFET on the high potential side and the collector of said pnp-transistor; and a power supply, the high potential side thereof being connected to the emitter of said pnp-transistor.

17. An output circuit for a power IC with a high breakdown voltage, said output circuit comprising:

a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, and an output terminal, said output terminal comprising a connection point connecting the source of said n-channel MOSFET on the high potential side and the drain of said n-channel MOSFET on the low potential side;

a level-shift circuit, said level-shift circuit driving said n-channel MOSFET on the high potential side;

a pnp-transistor with a high breakdown voltage, the gate thereof being connected to the output port of said level-shift circuit;

a first resistor between the gate of said n-channel MOSFET on the high potential side and the collector of said pnp-transistor;

a power supply, the high potential side thereof being connected to the emitter of said pnp-transistor;

a second resistor; and a diode;

wherein the first end of said second resistor and the cathode of said diode are connected to said gate of said n-channel MOSFET on the high potential side; and wherein second end of said second resistor and the an ode of said diode being connected to said source of said n-channel MOSFET on t he high potential side.

18. An output circuit for a power IC with a high breakdown voltage, said output circuit comprising:

a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, a diode and an output terminal, said terminal pot comprising a connection point connecting the source of said n-channel MOSFET on the high potential side and the anode of said diode, the cathode of said diode being connected to the drain of said n-channel MOSFET on the low potential side;

a level-shift circuit, said level-shift circuit driving said n-channel MOSFET on the high potential side;

a pnp-transistor with a high breakdown voltage, the gate thereof being connected to the output port of said level-shift circuit;

a first resistor between the gate of said n-channel MOSFET on the high potential side and the collector of said pnp-transistor;

a power supply, the high potential side thereof being connected to the emitter of said pnp-transistor;

a third resistor between said gate and said source of said n-channel MOSFET on the high potential side; and said gate of said n-channel MOSFET on the high potential side being connected to said cathode of said diode.

19. An output circuit for a power IC with a high breakdown voltage, said output circuit comprising:

a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, a diode, a first auxiliary diode, a second auxiliary diode and an output terminal, said output terminal comprising a connection point connecting the source of said n-channel MOSFET on the high potential side and the anode of said diode, the cathode of said diode being connected to the anode of said first auxiliary diode, the cathode of said first auxiliary diode being connected to the drain of said n-channel MOSFET on the low potential side, said source of said n-channel MOSFET on the high potential side being connected to the cathode of said second auxiliary diode;

a level-shift circuit, said level-shift circuit driving said n-channel MOSFET on the high potential side;

a pnp-transistor with a high breakdown voltage, the gate thereof being connected to the output port of said level-shift circuit;

a first resistor between the gate of said n-channel MOSFET on the high potential side and the collector of said pnp-transistor;

a power supply, the high potential side thereof being connected to the emitter of said pnp-transistor;

a third resistor between said gate and said source of said n-channel MOSFET on the high potential side; and said gate of said n-channel MOSFET on the high potential side being connected to said cathode of said diode.

20. An output circuit for a power IC with a high breakdown voltage, said output circuit comprising:

a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, and an output terminal, said output terminal comprising a connection point connecting the source of said n-channel MOSFET on the high potential side and the drain of said n-channel MOSFET on the low potential side;

a level-shift circuit, said level-shift circuit driving said n-channel MOSFET on the high potential side;

a pnp-transistor with a high breakdown voltage, the gate thereof being connected to the output port of said level-shift circuit;

a first resistor between the gate of said n-channel MOSFET on the high potential side and the collector of said pnp-transistor;

a power supply, the high potential side thereof being connected to the emitter of said pnp-transistor;

a third resistor between said gate and said source of said n-channel MOSFET on the high potential side;

a diode, the anode thereof being connected to said source of said n-channel MOSFET on the high potential side; and a first auxiliary n-channel MOSFET with a high breakdown voltage, the drain thereof being connected to said gate of said n-channel MOSFET on the high potential side;

wherein the gate of said auxiliary n-channel MOSFET being connected to the gate of said n-channel MOSFET on the low potential side; and wherein the source of said auxiliary n-channel MOSFET being connected to the source of said n-channel MOSFET on the low potential side.

21. An output circuit for a power IC with a high breakdown voltage, said output circuit comprising:

a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, and an output terminal, said output terminal comprising a connection point connecting the source of said n-channel MOSFET on the high potential side and the drain of said n-channel MOSFET on the low potential side;

a level-shift circuit, said level-shift circuit driving said n-channel MOSFET on the high potential side;

a pnp-transistor with a high breakdown voltage, the gate thereof being connected to the output port of said level-shift circuit;

a first resistor between the gate of said n-channel MOSFET on the high potential side and the collector of said pnp-transistor;

a power supply, the high potential side thereof being connected to the emitter of said pnp-transistor;

a third resistor between said gate and said source of said n-channel MOSFET on the high potential side; and a diode, an anode thereof being connected to said source of said n-channel MOSFET on the high potential side and a cathode of said diode being connected to said gate of said n-channel MOSFET on the high potential side;

a first auxiliary diode, an anode thereof being connected to said cathode of said diode; and a first axillary n-channel MOSFET with a high breakdown voltage, the drain thereof being connected to the cathode of said first auxiliary diode;

wherein the gate of said first auxiliary n-channel MOSFET being connected to the gate of said n-channel MOSFET on the low potential side; and wherein the source of said auxiliary n-channel MOSFET is connected to the source of said n-channel MOSFET on the low potential side.

22. An output circuit for a power IC with a high breakdown voltage, said output circuited comprising:

a totem-pole circuit, said totem-pole circuit comprising an n-channel MOSFET with a high breakdown voltage on a high potential side of said totem-pole circuit, an n-channel MOSFET with a high breakdown voltage on a low potential side of said totem-pole circuit, and an output terminal, said output terminal comprising a connection point connecting the source of said n-channel MOSFET on the high potential side and the drain of said n-channel MOSFET on the low potential side;

a level-shift circuit, said level-shift circuit driving said n-channel MOSFET on the high potential side;

a pnp-transistor with a high breakdown voltage, the gate thereof being connected to the output port of said level-shift circuit;

a first resistor between the gate of said n-channel MOSFET on the high potential side and the collector of said pnp-transistor;

a power supply, the high potential side thereof being connected to the emitter of said pnp-transistor;

a second resistor; and a diode;

wherein the first end of said second resistor and the cathode of said diode are connected to said gate of said n-channel MOSFET on the high potential side;

wherein the second end of said second resistor and the anode of said diode being connected to said source of said n-channel MOSFET on the high potential side;

wherein said drain of said n-channel MOSFET on the low potential side comprising a first region and a second region, said first region and said second region being spaced apart from each other;

wherein said first region is connected to said source of said n-channel MOSFET on the high potential side; and wherein said second region is connected to said gate of said n-channel MOSFET on the high potential side.

* * * * *